United States Patent
Molin et al.

(10) Patent No.: US 8,928,068 B2
(45) Date of Patent: Jan. 6, 2015

(54) VERTICAL SEMICONDUCTOR DEVICE WITH THINNED SUBSTRATE

(71) Applicant: Silanna Semiconductor U.S.A., Inc., San Diego, CA (US)

(72) Inventors: Stuart B. Molin, Carlsbad, CA (US); Michael A. Stuber, Carlsbad, CA (US)

(73) Assignee: Silanna Semiconductor U.S.A., Inc., San Diego, CA (US)

( * ) Notice: Subject to any disclaimer, the term of this patent is extended or adjusted under 35 U.S.C. 154(b) by 0 days.

(21) Appl. No.: 13/857,136

(22) Filed: Apr. 4, 2013

(65) Prior Publication Data
US 2013/0228855 A1 Sep. 5, 2013

Related U.S. Application Data

(63) Continuation of application No. 13/270,335, filed on Oct. 11, 2011, now Pat. No. 8,426,888.

(60) Provisional application No. 61/392,419, filed on Oct. 12, 2010.

(51) Int. Cl.
*H01L 29/66* (2006.01)
*H01L 29/78* (2006.01)
(Continued)

(52) U.S. Cl.
CPC .... *H01L 29/7812* (2013.01); *H01L 21/823487* (2013.01); *H01L 27/0823* (2013.01); *H01L 27/088* (2013.01); *H01L 29/0657* (2013.01); *H01L 29/66272* (2013.01); *H01L 29/66333* (2013.01); *H01L 29/66363* (2013.01); *H01L 29/73* (2013.01); *H01L 29/732* (2013.01); *H01L 29/7395* (2013.01); *H01L 29/744* (2013.01); *H01L 21/6835* (2013.01); *H01L 2221/68327* (2013.01); *H01L 2221/6834* (2013.01)

USPC .......... 257/329; 257/139; 257/E21.37

(58) Field of Classification Search
CPC ............ H01L 29/785; H01L 29/78696; H01L 29/66477; H01L 2924/13091; H01L 29/1095
USPC .................... 257/139, 329, E21.37
See application file for complete search history.

(56) References Cited

U.S. PATENT DOCUMENTS

| | | |
|---|---|---|
| 4,505,799 A | 3/1985 | Baxter |
| 4,819,037 A | 4/1989 | Sakakibara et al. |

(Continued)

OTHER PUBLICATIONS

Chung et al., "A New SOI MOSFET Structure with Junction Type Body Contact", School of Electrical Engineering & ISRC, Electron Devices Meeting, Dec. 1999, pp. 59-62, Seaoul National University, Kwanak-Gu, Seoul Korea.

(Continued)

*Primary Examiner* — Kimberly Rizkallah
*Assistant Examiner* — Duy T Nguyen
(74) *Attorney, Agent, or Firm* — The Mueller Law Office, P.C.

(57) ABSTRACT

A vertical semiconductor device (e.g. a vertical power device, an IGBT device, a vertical bipolar transistor, a UMOS device or a GTO thyristor) is formed with an active semiconductor region, within which a plurality of semiconductor structures have been fabricated to form an active device, and below which at least a portion of a substrate material has been removed to isolate the active device, to expose at least one of the semiconductor structures for bottom side electrical connection and to enhance thermal dissipation. At least one of the semiconductor structures is preferably contacted by an electrode at the bottom side of the active semiconductor region.

13 Claims, 14 Drawing Sheets

(51) Int. Cl.
*H01L 21/8234* (2006.01)
*H01L 27/082* (2006.01)
*H01L 27/088* (2006.01)
*H01L 29/06* (2006.01)
*H01L 29/73* (2006.01)
*H01L 29/732* (2006.01)
*H01L 29/739* (2006.01)
*H01L 29/744* (2006.01)
*H01L 21/683* (2006.01)

(56) References Cited

U.S. PATENT DOCUMENTS

| | | | |
|---|---|---|---|
| 5,212,397 | A | 5/1993 | See et al. |
| 5,571,741 | A | 11/1996 | Leedy |
| 5,907,169 | A | 5/1999 | Hshieh et al. |
| 6,084,284 | A | 7/2000 | Adamic, Jr. |
| 6,130,457 | A | 10/2000 | Yu et al. |
| 6,700,160 | B1 | 3/2004 | Merchant |
| 7,525,151 | B2 | 4/2009 | Haase |
| 7,576,404 | B2 | 8/2009 | Wilson et al. |
| 7,638,836 | B2 | 12/2009 | Walker |
| 7,651,897 | B2 | 1/2010 | Vashchenko et al. |
| 2004/0061163 | A1 | 4/2004 | Nakayama |
| 2004/0119076 | A1* | 6/2004 | Ryu ................ 257/77 |
| 2005/0242369 | A1 | 11/2005 | Udrea et al. |
| 2007/0152269 | A1 | 7/2007 | Haase |
| 2007/0284360 | A1 | 12/2007 | Santoruvo et al. |
| 2007/0284628 | A1 | 12/2007 | Kapoor |

OTHER PUBLICATIONS

Chung, Y. et al., "SOI MOSFET Structure with a Junction-Type Body Contact for Suppression of Pass Gate Leakage", IEEE Transactions on Electron Devices, Jul. 2011, pp. 1360-1365, vol. 48, No. 7.
International Search Report dated May 11, 2012 for PCT Application PCT/US2011/055671.
Notice of Allowance and Fees Due dated Jan. 22, 2013 for U.S. Appl. No. 13/270,339.
Office Action Dated Dec. 13, 2012 for U.S. Appl. No. 13/270,335.
Office Action dated Dec. 10, 2012 for U.S. Appl. No. 13/270,339.
Office Action dated Feb. 17, 2012 for U.S. Appl. No. 13/270,339.
Office Action dated Jun. 29, 2012 for U.S. Appl. No. 13/270,339.
Office Action dated Oct. 25, 2012 for U.S. Appl. No. 13/270,339.
Notice of Allowance and Fees dated Feb. 6, 2014 for U.S. Appl. No. 13/851,926.

* cited by examiner

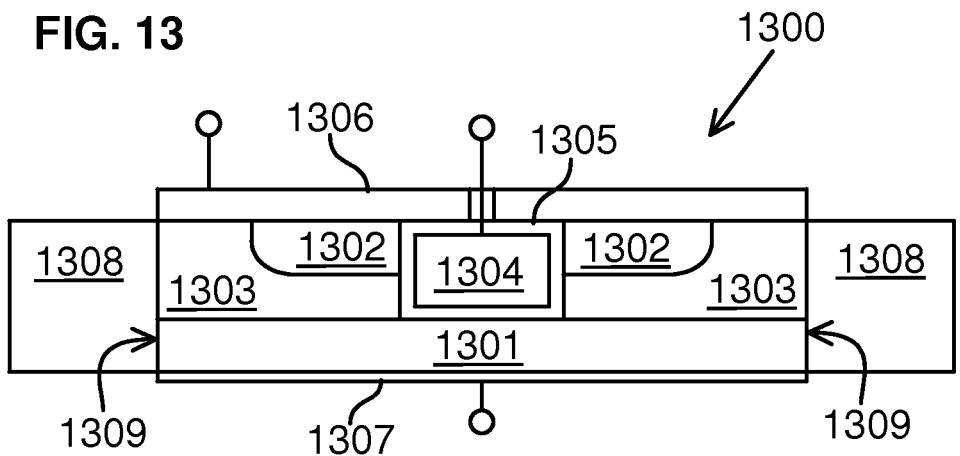
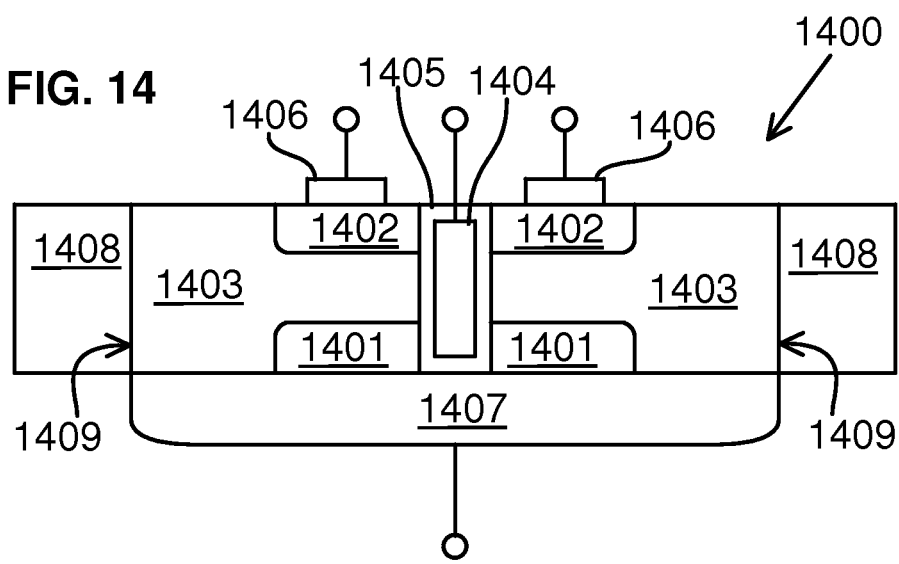
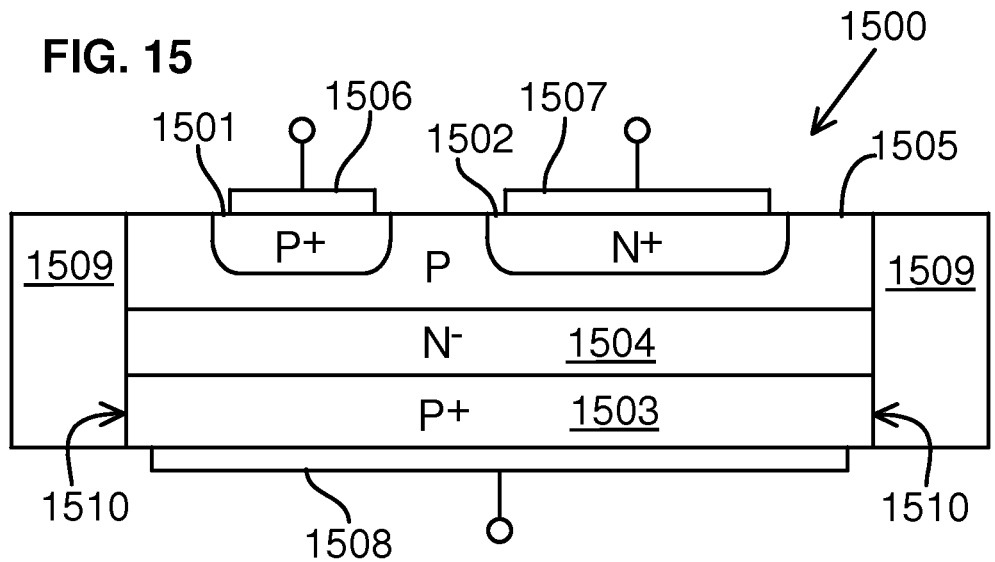

VERTICAL SEMICONDUCTOR DEVICE WITH THINNED SUBSTRATE

CROSS-REFERENCE TO RELATED APPLICATIONS

This application is a continuation of U.S. patent application Ser. No. 13/270,335 filed Oct. 11, 2011, now U.S. Pat. No. 8,426,888 issued on Apr. 23, 2013, which claims priority to U.S. Provisional Patent Application No. 61/392,419 filed Oct. 12, 2010, which are hereby incorporated by reference for all purposes.

BACKGROUND OF THE INVENTION

Semiconductor power devices have been in use since the early 1950s. They are specialized devices used as switches or rectifiers in power electronics circuits. Semiconductor power devices are characterized by their ability to withstand high voltages and large currents as well as the high temperatures associated with high power operation. For example, a switching voltage regulator will comprise two power devices that constantly switch on and off in a synchronized manner to regulate a voltage. The power devices in this situation need to sink system-level current in the on state, withstand the full potential of the power supply in the off state, and dissipate a large amount of heat. The ideal power device is able to operate in high power conditions, can rapidly switch between on and off states, and exhibits low thermal resistance.

A standard power device structure implemented using Metal-Oxide Semiconductor Field Effect Transistor (MOSFET) technology is the Vertical Diffused Metal-Oxide Semiconductor (VDMOS) structure. The VDMOS structure is also known as Double-diffused MOS (DMOS). The "vertical" term is used because current flows vertically through the device, and the "diffused" term is used because the channel and source regions are produced through a diffusion processing step. The structure can be described with reference to FIG. 1.

FIG. 1 displays a cross-section of a VDMOS power device 100. The power device 100 includes one or more source electrodes 101, a drain electrode 102, and a gate electrode 103. Source regions 104 are N+ doped in an n-type VDMOS device. In contrast to a standard MOSFET configuration, the source regions 104 are located on either side of a gate 105 below a gate insulator 106. Channel regions 107 are P+ doped in an n-type VDMOS device, and they are disposed between a drain region 108 and the source regions 104. In an n-type VDMOS device a high voltage applied to the gate electrode 103 will invert the channel regions 107 between the source regions 104 and the drain region 108. This configuration allows the power device 100 to withstand both a high voltage in the off state and a high current in the on state as compared to a standard MOSFET implemented using the same amount of die area. The channel width of the power device 100 is double that of a traditional MOSFET with the same die area thereby allowing the power device 100 to withstand large currents. In addition, the dimension that would usually be the channel length in a traditional MOSFET does not affect the breakdown voltage. Instead, the thickness and doping of the drain region 108 determines the breakdown voltage of the power device 100. The drain region 108 is usually the device substrate when a VDMOS device is implemented in a regular bulk semiconductor process.

The VDMOS power device 100 has certain disadvantageous aspects that limit it from performing as an ideal power device. For instance, there is a large junction capacitance formed by the boundary between the drain region 108 and the channel region 107. This capacitance is generally due to an area component set by a dimension 111 and a depth component set by a dimension 110. Since the junction formed by the drain region 108 and the channel region 107 must be charged or discharged when the power device 100 switches state, the capacitance of this junction degrades the performance of the power device 100. In addition, since the area component is limited, it is not possible to contact the source regions 104 and the channel regions 107 separately, since electrodes such as source electrode 101 can often consume a large amount of area. Furthermore, the power device 100 suffers from very poor thermal performance, since it is implemented on bulk semiconductor. Power devices implemented in bulk semiconductor typically have a minimum wafer thickness of approximately 200 μm due to the high incidence of wafer breakage when handling large-diameter wafers thinner than that. Since the thermal resistance of a silicon substrate is proportional to the thickness of the silicon substrate, the implementation of power devices on bulk semiconductor is problematic in terms of thermal performance. A high level of heat in an integrated circuit can shift the electrical characteristics of its devices outside an expected range causing critical design failures. Left unchecked, excess heat in a device can lead to permanent and critical failures in the form of warping or melting materials in the device's circuitry.

Additionally, layer transfer technology typically involves a pair of semiconductor wafers at various stages of processing that are bonded together using direct, molecular, or adhesive bonding. If one of the wafers is a semiconductor-on-insulator (SOI) or silicon-on-insulator wafer with the substrate removed to expose the buried oxide, the resulting structure comprises a device layer that is upside-down with respect to its original orientation and that has been transferred from an SOI wafer to a new handle wafer.

A layer transfer structure 200 is shown in FIG. 2. The layer transfer structure 200 includes a handle wafer 201 and an SOI wafer 202. The handle wafer 201 comprises a handle wafer substrate 203 and a handle bond layer 204. The SOI wafer 202 comprises an insulator layer 205 and a circuitry layer 206. The layer transfer structure 200 illustrates the finished product of a layer transfer process. However, before layer transfer begins, the SOI wafer 202 additionally comprises another layer of substrate material below the insulator layer 205. The substrate layer is typically a semiconductor material such as silicon. The insulator layer 205 is a dielectric which is often silicon-dioxide formed through the oxidation of the substrate silicon. The circuitry layer 206 includes a combination of dopants, dielectrics, polysilicon, metal layers, passivation, and other layers that are present after structures 207 have been formed therein. The structures 207 may include metal wiring; passive devices such as resistors, capacitors, and inductors; and active devices such as transistors. Layer transfer begins when the handle bond layer 204 is bonded to the top of the SOI wafer 202. At this point, the handle wafer 201 provides sufficient stability to the SOI wafer 202 such that the aforementioned layer of substrate material below the insulator layer 205 can be removed. As a result of this process, the layer transfer structure 200 provides a device that can be contacted through a bottom surface 208. This means that external contacts to the structures 207 in the circuitry layer 206 are extremely close to the structures 207 themselves. In some situations this distance is on the order of 1 micro-meter (μm).

As used herein and in the appended claims, the "top" of the layer transfer structure 200 references a top surface 209 while the "bottom" of the layer transfer structure 200 references the bottom surface 208. This orientation scheme persists regardless of the relative orientation of the circuitry layer 206 to other frames of reference, and the removal of layers from, or the addition of layers to the SOI wafer 202. Therefore, the circuitry layer 206 is always "above" the insulator layer 205. In addition, a vector originating in the center of the circuitry layer 206 and extending towards the bottom surface 208 will always point in the direction of the "back side" of the layer transfer structure regardless of the relative orientation of the SOI wafer 202 to other frames of references, and the removal of layers from, or the addition of layers to the SOI wafer 202.

It is with respect to these and other background considerations that the present invention has evolved.

BRIEF DESCRIPTION OF THE DRAWINGS

FIG. 13 is a simplified diagram of a cross-section of a UMOS device incorporating another alternative embodiment of the present invention.

FIG. 14 is a simplified diagram of a cross-section of another UMOS device incorporating another alternative embodiment of the present invention.

FIG. 15 is a simplified diagram of a cross-section of a Gate Turn Off (GTO) Thyristor device incorporating another alternative embodiment of the present invention.

DETAILED DESCRIPTION OF THE INVENTION

The present invention is illustrated in several related example embodiments described below. Each embodiment generally exhibits improvements in the performance metrics described in the background, e.g. electrical performance improvements in the ability to transition rapidly from an off state to an on state and thermal performance improvements in the ability to dissipate large amounts of heat. In addition, some of the embodiments enable additional benefits from the ability to independently bias the source and body of a power transistor. Additionally, some of the embodiments achieve some of the improvements or benefits by including layer transfer structures and techniques. Furthermore, some of the improvements or benefits are enabled by thinning the semiconductor substrate, whether using an SOI (semiconductor on insulator) or bulk semiconductor wafer, and with or without layer transfer structures and techniques. Also, some embodiments achieve some improvements by including an isolating trench around the active regions, which also benefits from the thinning of the semiconductor substrate to more thoroughly isolate the active regions. Additionally, some embodiments achieve some improvements by enabling the ability to integrate any desired number and combination of independent vertical semiconductor devices described herein (including multiple vertical power devices, among others) on one integrated circuit (IC) chip or die along with (or without) other additional analog or digital circuitry, including embodiments that do not have to form common drains for all of the devices via a common substrate. Furthermore, although the semiconductor material in many embodiments may be described herein as silicon, it is understood that the present invention is not necessarily so limited, but that other semiconductor materials (e.g. GaAs, SiC, GaN, InGaAs, InP, etc.) are generally within the scope of the present invention.

Reference now will be made in detail to some embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Figure 1:
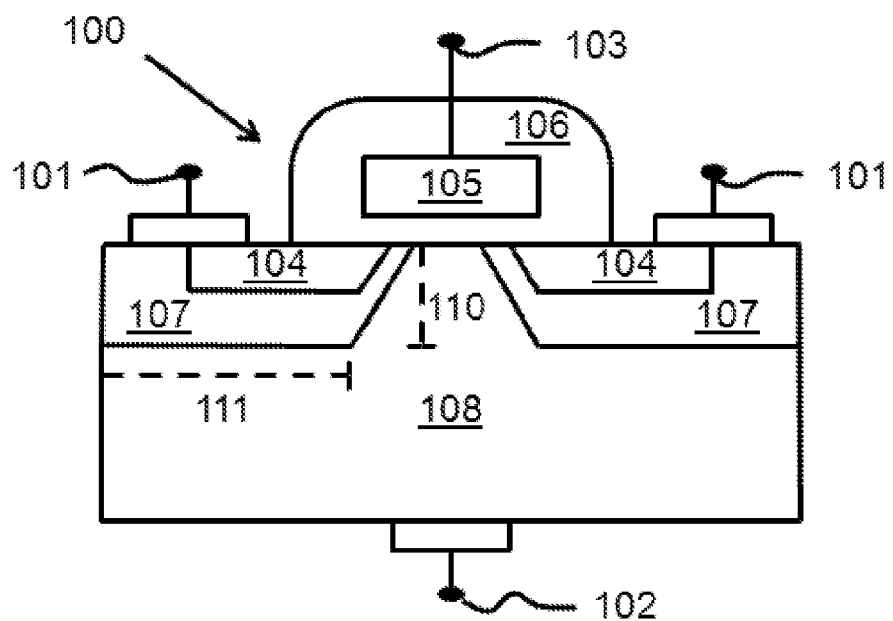
FIG. 1 is a simplified diagram of a cross-section of a prior art VDMOS power device.
Figure 2:
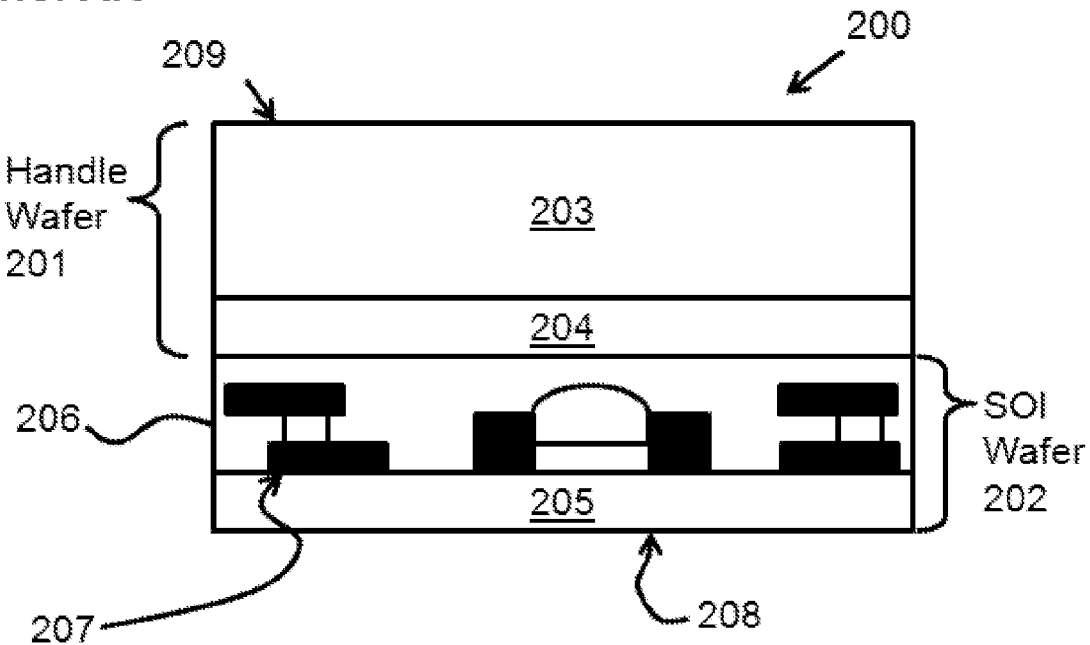
FIG. 2 is a simplified diagram of a cross-section of a prior art layer transfer structure.

Some embodiments of the present invention generally provide for vertical power devices having low parasitic capacitance, low thermal resistance, and high isolation. Some embodiments of the present invention achieve these beneficial results by eliminating portions, or minimizing a vertical and/or horizontal dimension, of the drain region 108 (FIG. 1) such that the capacitance between the drain and channel regions in the new devices is significantly reduced. In some embodiments of the present invention, the portion of the drain region 108 that is removed (e.g. due to thinning of the semiconductor substrate) is the portion of the drain region 108 below the channel region 107 such that the channel area in the new devices is generally decoupled from the internal capacitance of the new device. Some embodiments of the present invention utilize the resulting decoupling of the channel area and device performance to realize additional benefits such as providing a VDMOS for which the body and source can be connected independently without die area penalty. Additionally, some embodiments of the present invention provide for low thermal isolation by reducing the distance from the active, heat-generating region of the device to the back side of the device to approximately 1 um (i.e. thinning the semiconductor substrate) so that the most rapid thermal path is provided for the active regions of the device. In addition, some embodiments of the present invention implementing an NMOS and/or PMOS power device achieve the aforementioned beneficial results by redefining the roles of the drain and source regions such that the top electrode is connected to the drain region and a single back side contact connects to both the source and channel regions.

Figure 3:
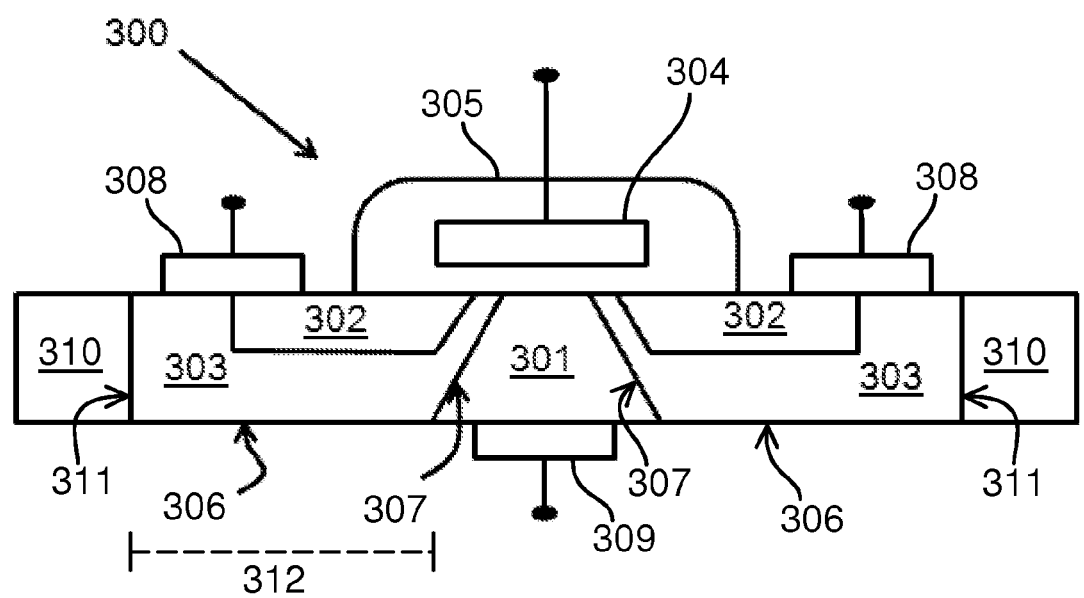
FIG. 3 is a simplified diagram of a cross-section of a vertical power device incorporating an embodiment of the present invention.

Some embodiments of the present invention can be described with reference to FIG. 3. FIG. 3 illustrates a vertical power device 300 that may form part of an overall IC chip and that is in accordance with the present invention. In various embodiments of the present invention, the vertical power device 300 is preferably either an NMOS or a PMOS vertical transistor. The vertical power device 300 generally comprises first, second and third semiconductor regions 301, 302 and 303 within an active surface layer, or active semiconductor region. (As used herein and in the appended claims, the "active layer" or "active semiconductor region" refers to the part of a semiconductor substrate in which semiconductor structures have been implanted, doped or deposited.) The vertical power device 300 also has a gate region 304 over the active layer. The first semiconductor region 301 is generally below the gate region 304, which is surrounded by an oxide/insulator 305. The second semiconductor region 302 is preferably of the same or similar electrical type as the first semiconductor region 301. (For example, if the vertical power device 300 is an n-type device then first and second semiconductor regions 301 and 302 are n-type regions.) The third semiconductor region 303 generally isolates the first semiconductor region 301 from the second semiconductor region 302. The third semiconductor region 303 has a bottom boundary 306 and a side boundary 307 that extends downward from the gate region 304 to the bottom boundary 306. The first semiconductor region 301 contacts the third semiconductor region 303 along the side boundary 307 and does not contact the third semiconductor region 303 along the bottom boundary 306. In other words, compared to the prior art drain region 108 of FIG. 1, vertical and horizontal dimensions of the first semiconductor region 301 have been minimized (e.g. to minimize parasitic capacitance, thermal resistance and electrical resistance). Additionally, the third semiconductor region 303 is preferably electrically complementary to the first semiconductor region 301 and the second semiconductor region 302. (For example, if the vertical power device 300 is an n-type device then the third semiconductor region 303 is p-type.)

In some embodiments of the present invention, the bottom boundary 306 is disposed on a buried insulator layer (not shown) of an SOI (or bulk semiconductor) substrate and is substantially normal to a line drawn directly from top electrode 308 to the back side of the wafer containing the vertical power device 300. In some embodiments of the present invention, a buried oxide layer is disposed on the back side of the first semiconductor region 301 and may also be disposed on the back side of the third semiconductor region 303. In addition, the buried oxide layer may be absent in certain locations to provide a back side contact (e.g. bottom side drain electrode 309) to either of these semiconductor regions 301 and/or 303.

In some embodiments of the present invention, the vertical power device 300 will comprise the single-gate structure shown and will be isolated by a trench oxide or shallow trench isolation (STI) region 310. However, a single power transistor is often comprised of many such single-gate structures. Each of these single gate structures is called a finger. Multiple fingers or multiple power devices may thus share (i.e. be surrounded by) the same trench oxide 310. Alternatively, an array of such power transistors may be created, each separated by the trench oxide 310.

The trench region 310 preferably extends along an entire vertical side 311 of the third semiconductor region 303. Thus, the trench region 310 generally penetrates through the entire active layer of the vertical power device 300. Additionally, the trench region 310 generally horizontally surrounds an entire active area of the vertical power device 300 (or the multiple fingers or the multiple power devices of which the vertical power device 300 is a part). The active area thus surrounded is generally electrically isolated from other active areas of other power devices or transistors on the same die. (The trench region 310, thus, generally eliminates the need to form devices with common drains in a common substrate, since the substrate is generally removed or thinned to the point that the trench region 310 completely (or almost completely) electrically isolates each device on the overall IC chip.) The manufacturing or fabrication process (including thinning of the semiconductor substrate) generally enables this feature for this and other embodiments of the present invention, as described below.

In some embodiments of the present invention, the first semiconductor region 301 serves as the drain of the vertical power device 300, the second semiconductor region 302 serves as the source of the vertical power device 300, and the third semiconductor region 303 serves as the body or channel region of the vertical power device 300. In some embodiments having this configuration of source and body, a single electrode such as top electrode 308 can be connected to both the third semiconductor (body/channel) region 303 and the second semiconductor (source) region 302 as certain benefits accrue from connecting the body and source in a power transistor device.

Several benefits accrue to embodiments of the present invention that are in accordance with the principles taught by FIG. 3. For instance, the junction between the third semiconductor region 303 and the first semiconductor region 301 forms one of the largest capacitances that must be charged and discharged when the vertical power device 300 switches between an on and off state. As such, the fact that no portion of the first semiconductor region 301 is below the bottom boundary 306 of the third semiconductor region 303 significantly reduces the capacitance of this junction and therefore increases the speed of the vertical power device 300. If the first semiconductor region 301 is used as the drain of the vertical power device 300, these embodiments effectively eliminate or minimize most or all of the area component of the body-to-drain capacitance and leave only the sidewall component, thereby resulting in lower parasitic capacitance and therefore higher performance. An additional benefit that accrues from the decoupling of the size of the horizontal area of the third semiconductor region 303 and the performance of the vertical power device 300 is that the third semiconductor region 303 can have a larger horizontal area and therefore lower resistance from the top electrode 308. Since it is advantageous to control the voltage of the third semiconductor region 303, a lower resistance is beneficial because the voltage will stay consistent throughout the extent of the third semiconductor region 303 and can be more accurately controlled. In some embodiments of the present invention, this advantageous aspect can also improve the breakdown voltage of the vertical power device 300 and leakage from the first semiconductor region 301 to the second semiconductor region 302.

Figure 4:
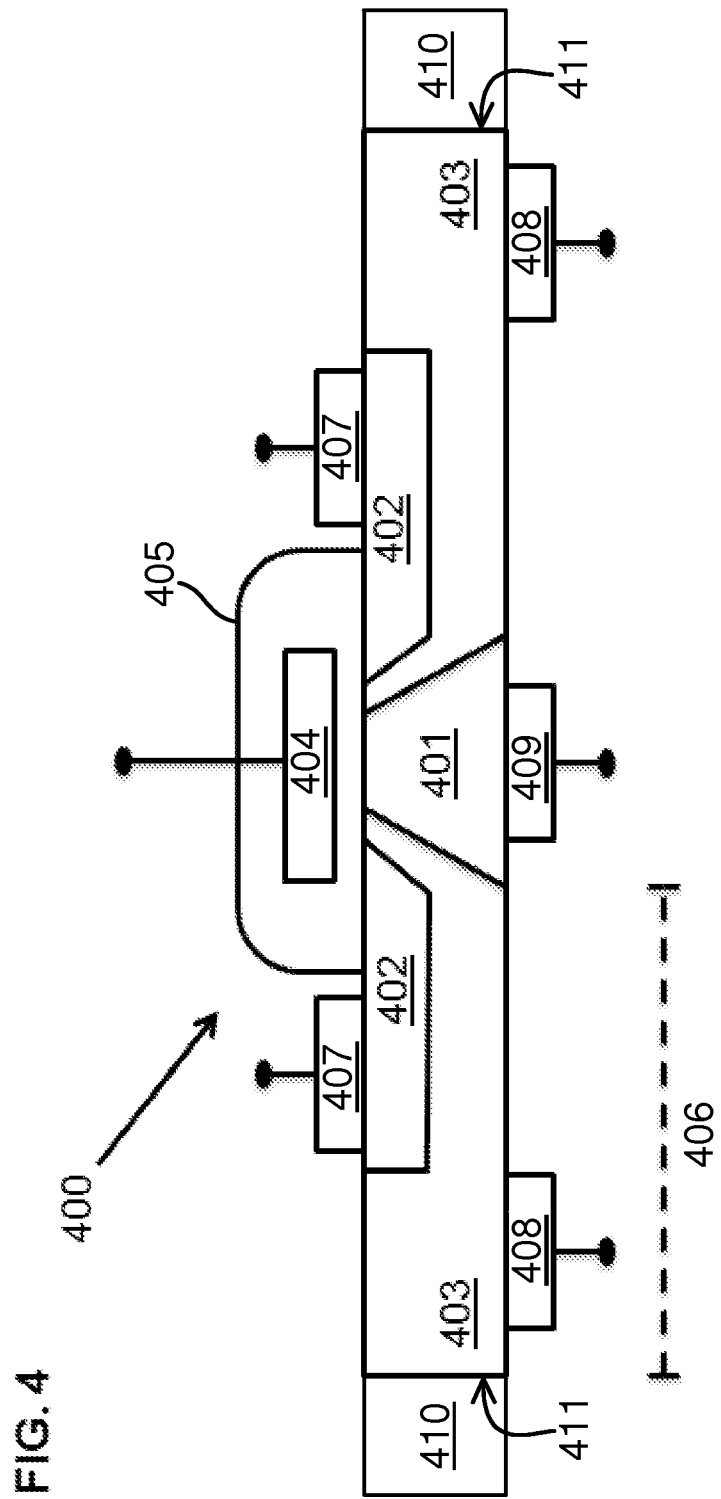
FIG. 4 is a simplified diagram of a cross-section of a vertical power device incorporating an alternative embodiment of the present invention.

Some embodiments of the present invention can be described with reference to FIG. 4. FIG. 4 displays a vertical power device 400 that may form part of an overall integrated circuit (IC) chip and that is in accordance with the present invention. The vertical power device 400 generally comprises first, second and third semiconductor regions 401, 402 and 403 within an active surface layer. The vertical power device 400 also generally comprises a gate region 404 (surrounded by a dielectric 405). The third semiconductor region 403 isolates the first and second regions 401 and 402. Similar to embodiments in accordance with FIG. 3, no portion of the first semiconductor region 401 is below the third semiconductor region 403, i.e. vertical and horizontal dimensions of the first semiconductor region 401 have been minimized (e.g. to minimize parasitic capacitance, thermal resistance and electrical resistance).

A dimension 406 (length of the third semiconductor region 403) is much larger in FIG. 4 as compared to a corresponding dimension 312 in FIG. 3. However, this difference does not limit the performance of the vertical power device 400 because the area of the third semiconductor region 403 has been decoupled from the internal capacitance of the vertical power device 400. Therefore, the second semiconductor region 402 can be connected to a top electrode 407 and the third semiconductor (channel) region 403 can be connected separately to a back (or bottom) side channel electrode 408 without increasing the size of the overall IC chip.

Also, due to this configuration, the area of the third semiconductor region 403 that is available for contacting the back side channel electrode 408 may be greater than is conventional without significantly increasing the size of the overall IC chip. A larger contact size has the benefit of decreasing the resistance between the third semiconductor region 403 and the back side channel electrode 408.

Additionally, due to this configuration, the back side channel electrode 408 can be placed on the third semiconductor region 403 as close as possible to the portion of the third semiconductor region 403 that is closest to a gate region 404 and directly between the first and second semiconductor regions 401 and 402. In this manner, resistance is further reduced.

Several benefits accrue to embodiments of the present invention that are in accordance with the principles taught by FIG. 4. In embodiments wherein the third semiconductor region 403 is the body/channel region of the vertical power device 400, this body region can be more directly controlled because the voltage biasing the second semiconductor region 402 is now independent of the body's bias voltage. In addition, in embodiments where the second semiconductor region 402 is the source of the vertical power device 400, the fact that the channel and source can be biased independently allows for the formation of a dynamic threshold MOS (DTMOS) transistor. The threshold voltage of a DTMOS transistor is modified using the body effect to bring about beneficial electrical performance. When a DTMOS transistor is off, the threshold voltage of the transistor can be set high through control of the body voltage resulting in very low leakage currents and a high breakdown voltage during the off state. When the transistor is in the on state an increased body voltage reduces the threshold voltage, thereby increasing the current flowing through the transistor in all regions of operation. This improved current flow results in improved power transistor efficiency.

Another benefit of these embodiments is that the separate contacts to the first and third semiconductor regions 401 and 403 offer a low thermal resistance path for heat that is built up in the active region of the vertical power device 400. The back side channel electrode 408 and a bottom side electrode 409 (connected to the first semiconductor region 401) are routed using metal with much lower thermal resistance as compared to bulk semiconductor or any buried oxide that may be disposed on the backside of the vertical power device 400. Also, since the connection to the third semiconductor region 403 is not routed up through the vertical power device 400 before providing a path out of the overall IC chip, the path for heat dissipation is much shorter and is therefore more efficient. Typical substrate thicknesses for bulk vertical power devices are about 200 μm. However, the semiconductor thickness for the vertical power device 400 shown in FIG. 4 is about 1 μm (e.g. due to thinning of the semiconductor substrate). The resulting distance from the heat-generating active region to the metal contact on the back of the overall IC chip is thus reduced by approximately 99.5% from the previous value, with thermal resistance of the semiconductor layer similarly reduced by 99.5%.

In some embodiments of the present invention, all of the electrodes in FIG. 4, including the top electrode 407 and an electrode for the gate region 404, in addition to the back side channel electrode 408 and the bottom side electrode 409, can be contacted on the back side of the wafer containing the vertical power device 400. To create this configuration using only one layer of metal routing above the active region, the electrodes connected to the top side of the vertical power device 400 can be routed through a plane extending out of the page. In some embodiments of the present invention, any combination of back and front side contacts can be used to provide optimal thermal resistance for heat performance and optimal series resistance for accurate bias conditions. In addition, back and front side contacts can be mixed as shown in FIG. 4 to save space as contacts to the third semiconductor region 403 and the second semiconductor region 402 can be located in the same vertical slice of the wafer containing the vertical power device 400.

In some embodiments of the present invention, the body of the DTMOS formed by vertical power device 400 can be routed out and connected to another circuit element that will bias the body when the transistor is turned on and off. For example, the body bias could be 0 or −2 V when a 2.5 V power supply transistor is off, and 0.6 V when the gate is turned on at 2.5 V. This increases the body voltage when the gate voltage is increased, but not enough to forward bias the body with respect to the source and drain. This is beneficial given that the gate voltage should be as high as possible for low $R_{on}$ and high drive strength. This allows enhanced performance without forward bias problems.

Also shown in FIG. 4 is a trench region 410 (e.g. similar to trench region 310 of FIG. 3). The trench region 410 preferably extends along an entire vertical side 411 of the third semiconductor region 403. Thus, the trench region 410 generally penetrates through the entire active layer of the vertical power device 400. Additionally, the trench region 410 generally horizontally surrounds an entire active area of the vertical power device 400 (or the multiple fingers or the multiple power devices of which the vertical power device 400 is a part). The active area thus surrounded is generally electrically isolated from other active areas of other power devices or transistors on the same die. The manufacturing or fabrication process (including thinning of the semiconductor substrate) generally enables this feature for this and other embodiments of the present invention, as described below.

Figure 5:
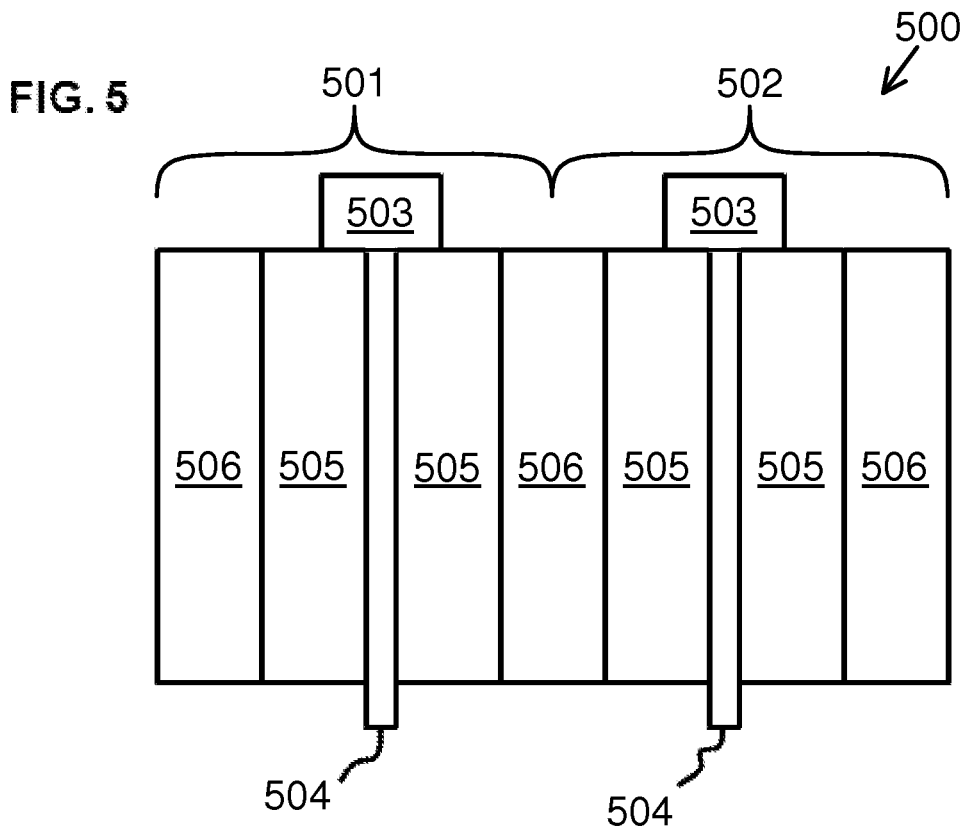
FIG. 5 is a simplified diagram of an example plan layout pattern for a vertical power device incorporating an embodiment of the present invention.

Some embodiments of the present invention can be described with reference to FIG. 5. FIG. 5 displays a top view of a potential layout pattern for a vertical power device 500, having two fingers 501 and 502, that may form part of an overall integrated circuit (IC) chip and that is in accordance with the present invention. FIG. 5 will be described with reference to an n-type vertical power device with a drain region that is back side contacted. However, a similar layout pattern will work for a p-type vertical power transistor and for a vertical power transistor having a drain region on the top side. The two fingers 501 and 502 generally comprise gate electrodes 503 that are coupled to poly-silicon running along gate regions 504. The gate regions 504 cover a strip of n-type material that forms the first semiconductor region 301 and 401 in FIGS. 3 and 4 which in this case is the drain of the vertical power device 500. The gate regions 504 may also cover a portion of the third semiconductor region 303 and 403, which in this case is the channel region and is preferably p-type material. Source regions 505 generally comprise the second semiconductor regions 302 and 402 from FIGS. 3 and 4. These regions 505 are also preferably n-type in this case. The source regions 505 cover strips of p-type material which comprise the channel region of the vertical power device 500. Exposed channel regions 506 are p-type material which also comprises a portion of the channel region of the vertical power device 500. However, the exposed channel regions 506 are left uncovered so that they may be contacted from the top. Regions 505 and 506 are each made large enough or wide enough to provide an area for an electrical contact without directly diminishing the performance of the vertical power device 500 because, as described above, dimension 406 (FIG. 4) can be expanded without increasing any critical internal capacitance of the vertical power device 500. Additionally, the entire structure of the vertical power device 500 is preferably horizontally surrounded by the trench region 310 or 410 (FIGS. 3 and 4) to electrically isolate the vertical power device 500 from other active areas of other power devices or transistors on the same die.

Figure 6:
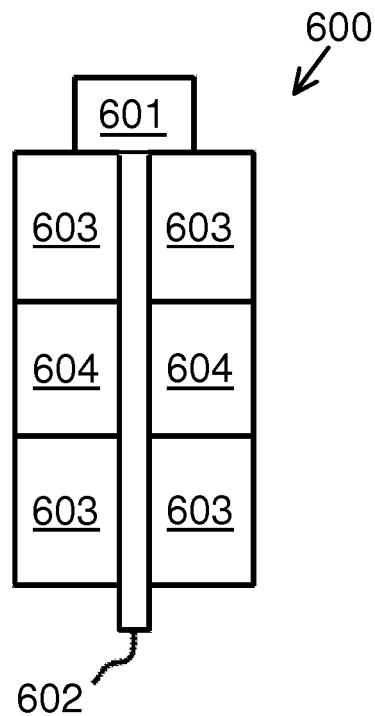
FIG. 6 is a simplified diagram of another example plan layout pattern for a vertical power device incorporating an embodiment of the present invention.

Some embodiments of the present invention can be described with reference to FIG. 6. FIG. 6 displays a top view of a potential layout pattern for a vertical power device 600 that may form part of an overall integrated circuit (IC) chip and that is in accordance with the present invention. FIG. 6 will be described with reference to an n-type vertical power device with a drain region connected on the back side. However, a similar layout pattern will work for a p-type vertical power transistor. The vertical power device 600 generally comprises a gate electrode 601 which is coupled to poly-silicon running along a gate region 602. The gate region 602 covers a strip of material that forms the first semiconductor region 301 and 401 in FIGS. 3 and 4, which in this case is the n-type drain of the vertical power device 600. Source regions 603 cover strips of material that comprise the channel region of the vertical power device 600, which in this case is p-type. Exposed channel regions 604 are p-type material, which also comprises a portion of the channel region of the vertical power device 600. The exposed channel regions 604 have been left uncovered by the n-type material in the source regions 603. These regions 604 can be made large enough to allow for electrical contact to the channel region in these locations. This layout is generally more space-efficient than the layout shown in FIG. 5, but the series resistance of the body voltage will be slightly higher, since there are regions of the channel (e.g. along the length of the source regions 603) that will be relatively far from the channel contacts. Additionally, the entire structure of the vertical power device 600 is preferably horizontally surrounded by the trench region 310 or 410 (FIGS. 3 and 4) to electrically isolate the vertical power device 600 from other active areas of other power devices or transistors on the same die.

Figure 7:
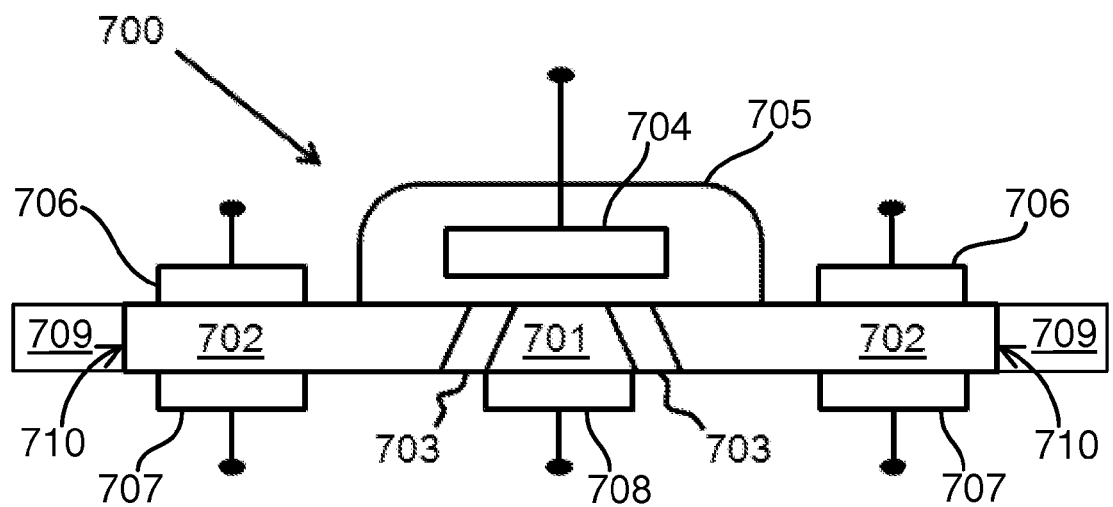
FIG. 7 is a simplified diagram of a cross-section of a vertical power device incorporating another alternative embodiment of the present invention.

Some embodiments of the present invention can be described with reference to FIG. 7. FIG. 7 displays a vertical power device 700 that may form part of an overall integrated circuit (IC) chip and that is in accordance with the present invention. The vertical power device 700 generally comprises first, second and third semiconductor regions 701, 702 and 703 within an active surface layer. The vertical power device 700 also has a gate region 704 (surrounded by an oxide/insulator 705) over the active layer. The third semiconductor region 703 isolates the first semiconductor region 701 from the second semiconductor region 702. The first semiconductor region 701 and the second semiconductor region 702 are generally the same type of semiconductor material, and the third semiconductor region 703 is a complementary semiconductor material. A distinguishing feature of embodiments illustrated by FIG. 7 is that there is a portion of the third semiconductor region 703 (extending out of the plane of the page) that is laterally and vertically coextensive with the second semiconductor 702 and mutually exclusive with the first and second semiconductor regions 701 and 702. In other words, in some embodiments of the present invention generally involving thinning of the semiconductor substrate, not only is the material that comprises the first semiconductor region 701 completely absent from below both the third and second semiconductor regions 703 and 702, but the material that comprises the third semiconductor region 703 is also completely absent from below the second semiconductor region 702. In other words, vertical and/or horizontal dimensions of the first and third semiconductor regions 701 and 703 have been minimized (e.g. to minimize parasitic capacitance, thermal resistance and electrical resistance).

Variations discussed above with reference to FIGS. 3 and 4 can be applied to embodiments taught by FIG. 7. For example, the vertical power device 700 can implement an n-type power device if the second semiconductor region 702 and the first semiconductor region 701 are n-type and the third semiconductor region 703 is p-type. However, the vertical power device 700 can also implement a p-type power device.

Several benefits generally accrue to embodiments of the present invention that are in accordance with the principles taught by FIG. 7. As seen in FIG. 7, generally due to thinning of the semiconductor substrate and further backside processing, the second semiconductor regions 702 can be contacted on either the front or the back side through top electrodes 706 or bottom electrodes 707, respectively. Similarly, the third semiconductor regions 703 can be contacted on either the front or back side through top or bottom electrodes (not shown) since the third semiconductor region 703, which is generally the channel region of the vertical power device 700, can be routed out of the plane of the drawing and contacted elsewhere separately from any contact to either of the other two semiconductor regions 701 and/or 702. (These options for contacting the second and third semiconductor regions 702 and 703 generally do not affect the size of the overall IC chip.) The first semiconductor region 701, on the other hand, is preferably connected through a bottom electrode 708, since the gate region 704 and the oxide/insulator 705 obscure the front side of the first semiconductor region 701. Therefore, all three semiconductor regions 701, 702 and 703 of the vertical power device 700 can potentially be contacted on the back side which provides significant advantages in terms of heat dissipation as described above. In addition, this configuration maintains the benefits described above regarding separate contacts for the second semiconductor region 702 and the third semiconductor region 703. Also, due to this configuration, the area of the second or third semiconductor region 702 or 703 that is available for contacting the top or bottom electrodes 706 or 707 (and similar electrodes for the third semiconductor region 703) may be greater than is conventional without significantly increasing the size of the overall IC chip. A larger contact size has the benefit of decreasing the resistance between the second or third semiconductor region 702 or 703 and the top or bottom electrodes 706 or 707 (and similar electrodes for the third semiconductor region 703).

Also shown in FIG. 7 is a trench region 709 (e.g. similar to trench region 310 or 410 of FIG. 3 or 4). The trench region 709 preferably extends along an entire vertical side 710 of the second semiconductor region 702 (and of the third semiconductor region 703, but outside of the plane of the drawing). Thus, the trench region 709 generally penetrates through the entire active layer of the vertical power device 700. Additionally, the trench region 709 generally horizontally surrounds an entire active area of the vertical power device 700 (or the multiple fingers or the multiple power devices of which the vertical power device 700 is a part). The active area thus surrounded is generally electrically isolated from other active areas of other power devices or transistors on the same die. The manufacturing or fabrication process (including thinning of the semiconductor substrate) generally enables this feature for this and other embodiments of the present invention, as described below.

Figure 8:
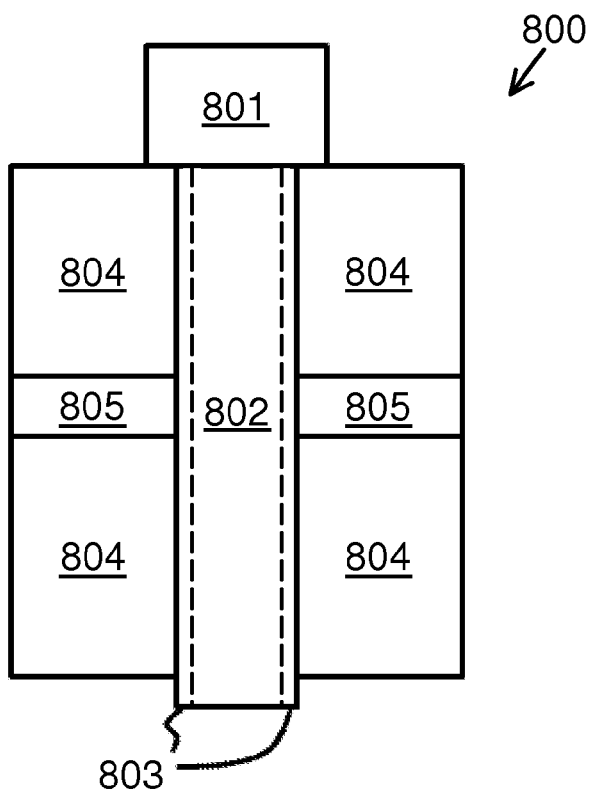
FIG. 8 is a simplified diagram of another example plan layout pattern for a vertical power device incorporating an embodiment of the present invention.

Some embodiments of the present invention can be described with reference to FIG. 8. FIG. 8 displays a top view of a layout pattern for a vertical power device 800 that may form part of an overall integrated circuit (IC) chip and that is in accordance with the present invention. FIG. 8 will be described with reference to an n-type vertical power device with a drain region connected on the back side. However, a similar layout pattern will work for a p-type vertical power transistor and for a vertical power transistor having a drain region connected on the top side. The vertical power device 800 generally comprises a gate electrode 801 which is coupled to poly-silicon running along a gate region 802, which includes gate edge regions 803 delineated by dashed lines. The part of the gate region 802 between the two dashed lines covers a strip of material that generally forms the first semiconductor region 701 in FIG. 7, which in this case is the n-type drain of the vertical power device 800. The gate edge regions 803 cover two strips of material that generally form the third semiconductor region 703 in FIG. 7, which in this case is the p-type channel of the vertical power device 800. Source regions 804 generally comprise the second semiconductor region 702 in FIG. 7, which in this case is the n-type source of the vertical power device 800. The source regions 804 preferably do not cover any other active material. Channel regions 805 are exposed portions of active semiconductor material that are coupled to the channel region (the third semiconductor region 703) covered by the gate edge region 803. The channel regions 805 comprise the same material that is covered by the poly-silicon of the gate-edge region 803 which in this case is the p-type channel of the vertical power device 800. The channel regions 805 are exposed to provide channel contacts and, in some embodiments, they can be made just large enough to allow for a single electrical contact to save space. This layout is generally more space efficient than the layout shown in FIG. 5, but the series resistance of the body voltage will be slightly higher since there are regions of the channel (e.g. along the length of the source regions 804) that will be relatively far from the channel contacts. Additionally, the entire structure of the vertical power device 800 is preferably horizontally surrounded by the trench region 709 (FIG. 7) to electrically isolate the vertical power device 800 from other active areas of other power devices or transistors on the same die.

Figure 9:
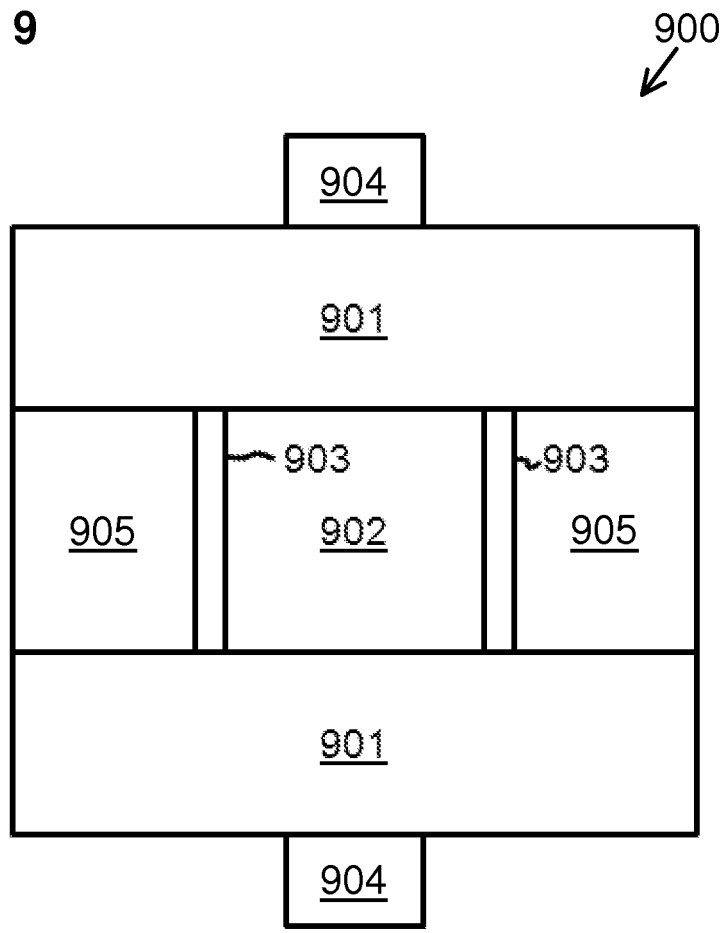
FIG. 9 is a simplified diagram of another example plan layout pattern for a vertical power device incorporating an embodiment of the present invention.

Some embodiments of the present invention can be described with reference to FIG. 9. FIG. 9 displays a top view of a layout pattern for a vertical power device 900 that may form part of an overall integrated circuit (IC) chip and that is in accordance with the present invention. FIG. 9 will be described with reference to an n-type vertical power device with a drain region connected on the back side. However, a similar layout pattern will work for a p-type vertical power transistor and for a vertical power transistor having a drain region contacted on the top side. The vertical power device 900 generally comprises gate regions 901, 902 and 903, which generally comprise a poly-silicon material. The vertical power device 900 also generally comprises body contacts 904 which preferably allow for either top or bottom contact to a region of p-type material that forms a channel region of the vertical power device 900 generally under the gate regions 901 and 903. The vertical power device 900 also generally comprises an n-type material that forms the drain of the vertical power device 900 under the gate region 902 and an n-type material that forms a source of the vertical power device 900 in regions 905. The p-type material under the gate region 903 generally isolates the drain under the gate region 902 from the source regions 905. The source regions 905 preferably allow for either top or bottom contact. Additionally, the entire structure of the vertical power device 900 is preferably horizontally surrounded by the trench region 709 (FIG. 7) to electrically isolate the vertical power device 900 from other active areas of other power devices or transistors on the same die.

Figure 10:
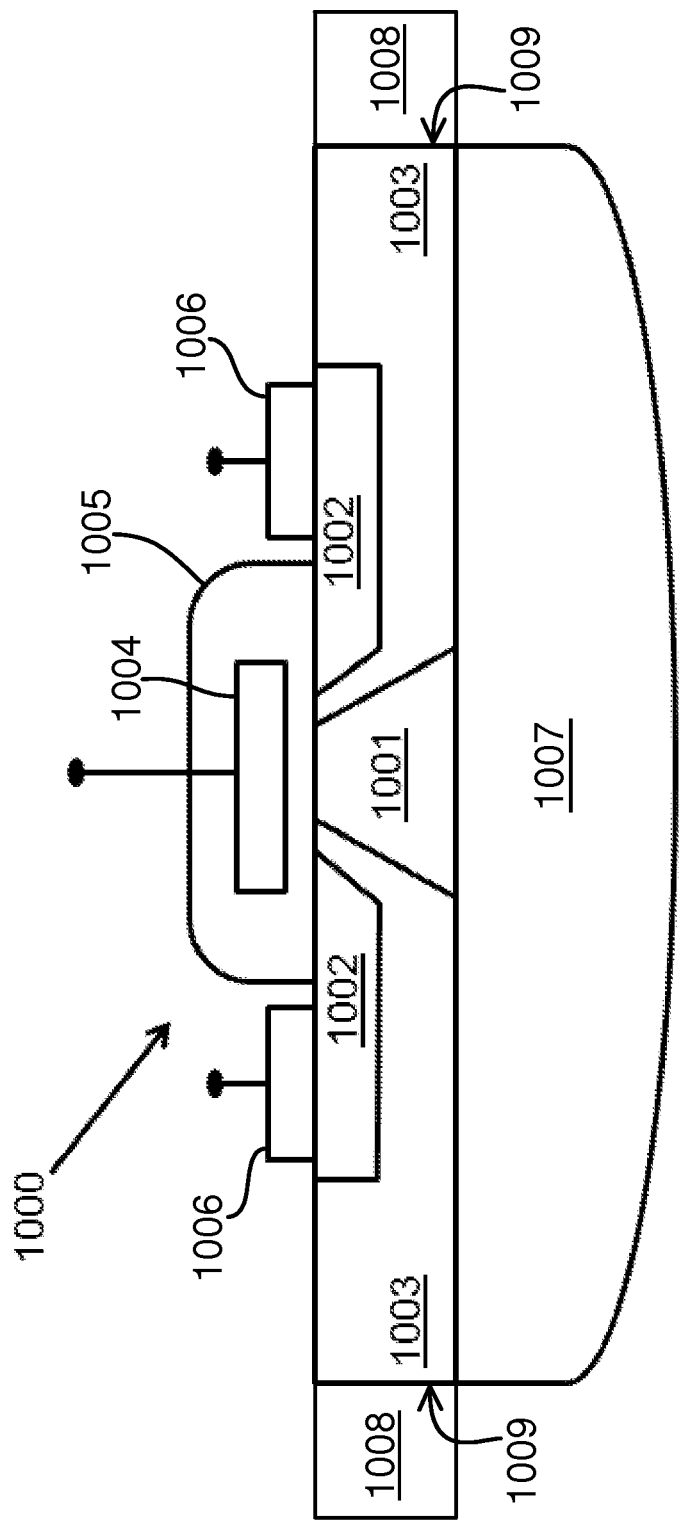
FIG. 10 is a simplified diagram of a cross-section of a vertical power device incorporating another alternative embodiment of the present invention.

Some embodiments of the present invention can be described with reference to FIG. 10. FIG. 10 displays a vertical power device 1000 that may form part of an overall integrated circuit (IC) chip and that is in accordance with the present invention. The vertical power device 1000 generally comprises first, second and third semiconductor regions 1001, 1002 and 1003 within an active surface layer. The vertical power device 1000 also has a gate region 1004 (surrounded by an oxide/insulator 1005) over the active layer. The first semiconductor region 1001 and the second semiconductor region 1002 are generally isolated from each other by the third semiconductor region 1003. In some embodiments of the present invention, the first semiconductor region 1001 preferably serves as the source of the vertical power device 1000 and the second semiconductor region 1002 preferably serves as the drain of the vertical power device 1000. Similar to embodiments in accordance with FIGS. 3 and 4, no portion of the first semiconductor region 1001 is below the third semiconductor region 1003, i.e. vertical and horizontal dimensions of the first semiconductor region 1001 have been minimized (e.g. to minimize parasitic capacitance, thermal resistance and electrical resistance). One or more top electrodes 1006 preferably contact those regions (e.g. the second semiconductor region 1002) that it is desired to contact from the top side. The back side of the vertical power device 1000, however, is generally covered by a metal contact (bottom side electrode) 1007 which preferably comprises either a single solder bump or a copper pillar. In some embodiments of the present invention, this single metal contact 1007 is preferably deposited upon an intervening dielectric layer (not shown) with portions removed to provide for a contact from the metal to the active layers (the first and third semiconductor regions 1003 and 1001). In some embodiments of the present invention with very low thermal resistance, all of the intervening dielectric layers between the vertical power device 1000 and the metal contact 1007 are preferably removed. In some embodiments of the present invention, a shared backside contact (e.g. similar to metal contact 1007) can also be applied to embodiments of the present invention that are in accordance with those taught by FIG. 7. In this case, the channel contact (for the third semiconductor region 703) can be shared with either of the other two semiconductor regions 701 or 702 depending upon whether either of the semiconductor regions 701 or 702 are defined as the source or drain. However, in these embodiments a single back side contact may have to be applied to a patterned back side insulating layer or be applied in a careful pattern to avoid shorting the source and drain.

In some embodiments of the present invention, the metal contact 1007 is preferably shared among multiple fingers of a single power transistor, of which the vertical power device 1000 comprises a part. Typical solder bump and copper pillar dimensions are about 80-200 μm in diameter. A typical transistor finger dimension can be on the order of 1 μm. Therefore, a single metal contact is typically much too large for a single transistor finger. However, power transistors usually have many fingers of transistor width arranged in parallel to provide a low impedance current path. The overall dimension of a many-fingered power transistor is often on the order of a solder bump or copper pillar. The metal contact 1007 may thus cover many transistor fingers of a single power transistor. Since the source and channel regions of all the fingers of a power transistor can be all held at the same potential, this configuration generally presents no problem for the operation of the power transistor. As mentioned previously, in some embodiments of the present invention having many-fingered power transistors, all of the intervening dielectric can be removed between the first semiconductor region 1001, the third semiconductor region 1003 and the metal contact 1007.

Several benefits accrue to embodiments of the present invention that are in accordance with the principles taught by FIG. 10. For example, the vertical power device 1000 can be extremely space efficient, because a single contact can be used for the body and source of the vertical power device 1000 as in the top-contacted vertical power device 300 of FIG. 3. However, the metal contact 1007 generally provides a significant thermal performance enhancement for the vertical power device 1000, because the metal contact 1007 provides a direct thermal path out of the overall IC chip, and because nearly the entire area of active material for both the source and body regions (i.e. the semiconductor regions 1001 or 1003) is in direct contact with this efficient direct thermal path. Furthermore, because the semiconductor layer is generally much thinner than that of the prior art, the thermal resistance vertically through the semiconductor layer from the heat-generating active layer to the metal contact 1007 is extremely low, resulting in extremely efficient heat removal from the vertical power device 1000.

Also shown in FIG. 10 is a trench region 1008 (e.g. similar to trench region 310, 410 or 709 of FIG. 3, 4 or 7). The trench region 1008 preferably extends along an entire vertical side 1009 of the third semiconductor region 1003. Thus, the trench region 1008 generally penetrates through the entire active layer of the vertical power device 1000. Additionally, the trench region 1008 generally horizontally surrounds an entire active area of the vertical power device 1000 (or the multiple fingers or the multiple power devices of which the vertical power device 1000 is a part). The active area thus surrounded is generally electrically isolated from other active areas of other power devices or transistors on the same die. Additionally, the metal contact 1007 may be relatively large, generally extending throughout an area defined or enclosed by the trench region 1008, within which are multiple fingers or multiple power devices of which the vertical power device 1000 is a part. Furthermore, multiple such areas defined or enclosed by multiple trench regions 1008 may be in a single IC chip, and each such area may have a separate relatively large metal contact 1007. The manufacturing or fabrication process (including thinning of the semiconductor substrate) generally enables this feature for this and other embodiments of the present invention, as described below.

Figure 11:
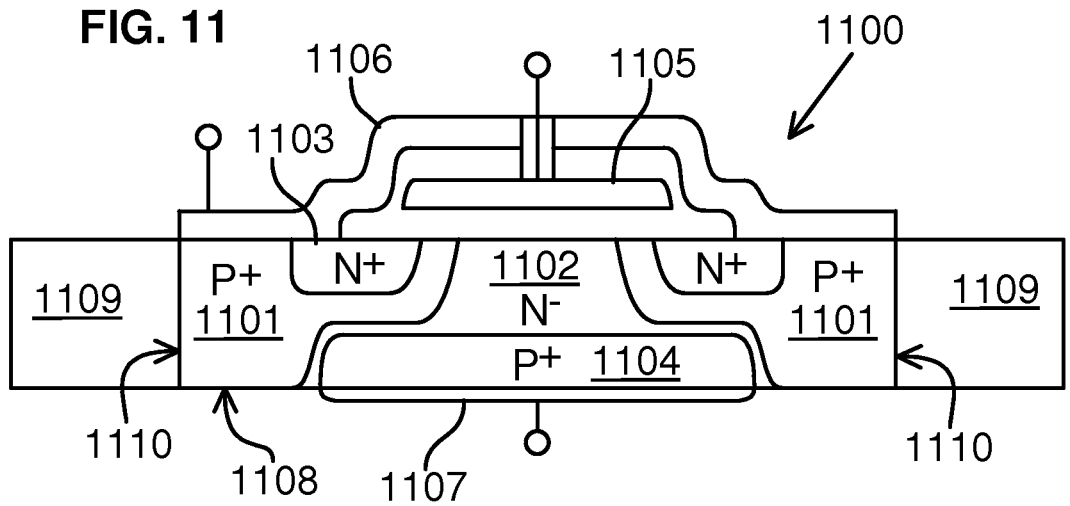
FIG. 11 is a simplified diagram of a cross-section of an Insulated Gate Bipolar Transistor (IGBT) device incorporating another alternative embodiment of the present invention.

Some embodiments of the present invention can be described with reference to FIG. 11. FIG. 11 displays a vertical Insulated Gate Bipolar Transistor (IGBT) device 1100 that may form part of an overall integrated circuit (IC) chip and that is in accordance with the present invention. An IGBT device is very similar to a vertical power device and can be manufactured using very similar techniques to those described for the vertical power devices described herein. The IGBT device 1100 generally comprises a base region 1101, a channel region 1102, an emitter region 1103 and a collector region 1104 within an active surface layer. The IGBT device 1100 also generally comprises a gate region 1105, an emitter/base electrode 1106 and a bottom side collector electrode 1107. Due to the manufacturing technique described below (including thinning of the semiconductor substrate and further backside processing), the collector electrode 1107 is preferably placed on the back side of the overall IC chip. Also, the IGBT device 1100 is preferably thinned from top to bottom, resulting in reduced vertical resistance. Additionally, similar to the removal of a portion of the first semiconductor region 301 from beneath the third semiconductor region 303 in FIG. 3, a portion of the channel region 1102 is preferably removed from beneath a bottom boundary 1108 of the base region 1101, i.e. vertical and horizontal dimensions of the channel region 1102 have been minimized (e.g. to minimize parasitic capacitance, thermal resistance and electrical resistance). In general, though, the channel region 1102 must be left with a minimum thickness between the base region 1101 and the collector region 1104, so the base region 1101 and the collector region 1104 do not short out or break down during operation. Furthermore, the overall thinning of the IGBT device 1100 generally results in lower thermal resistance.

Also shown in FIG. 11 is a trench region 1109 (e.g. similar to trench region 310, 410, 709 or 1008 of FIG. 3, 4, 7 or 10). The trench region 1109 preferably extends along an entire vertical side 1110 of the base region 1101. Thus, the trench region 1109 generally penetrates through the entire active layer of the IGBT device 1100. Additionally, the trench region 1109 generally horizontally surrounds an entire active area of the IGBT device 1100 (or the multiple fingers or the multiple devices of which the IGBT device 1100 is a part). The active area thus surrounded is generally electrically isolated from other active areas of other devices or transistors on the same die. The manufacturing or fabrication process (including thinning of the semiconductor substrate) generally enables this feature for this and other embodiments of the present invention, as described below.

Figure 12:
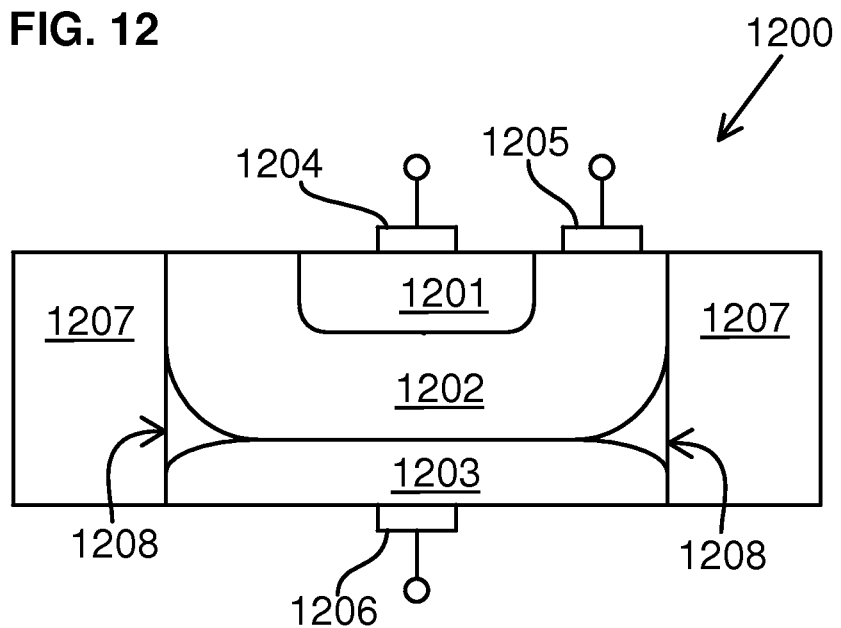
FIG. 12 is a simplified diagram of a cross-section of a vertical bipolar transistor device incorporating another alternative embodiment of the present invention.

Some embodiments of the present invention can be described with reference to FIG. 12. FIG. 12 displays a vertical bipolar transistor 1200 that may form part of an overall integrated circuit (IC) chip and that is in accordance with the present invention. The vertical bipolar transistor 1200 generally comprises an emitter region 1201, a base region 1202 and a collector region 1203 within an active surface layer of a substrate in a vertical orientation. The vertical bipolar transistor 1200 also generally comprises an emitter electrode 1204, a base electrode 1205 and a bottom side collector electrode 1206. Due to the manufacturing technique described below (including thinning of the semiconductor substrate and further backside processing), the collector electrode 1206 is preferably placed on the back side of the overall IC chip. Additionally, the collector region 1203 is optionally formed by back side implantation/doping. As a result, this configuration generally eliminates a lateral buried layer or a vertical sinker region (common in prior art devices) and the resistance due to these structures. Additionally, this configuration generally results in greater junction isolation, thereby generally eliminating or minimizing parasitic capacitance of the collector region 1203 to the substrate. Furthermore, an NPNP latch-up path (common in prior art devices) is also eliminated. In addition, the overall thinning of the vertical bipolar transistor 1200 generally results in lower thermal resistance.

Also shown in FIG. 12 is a trench region 1207 (e.g. similar to trench region 310, 410, 709, 1008 or 11081109 of FIG. 3, 4, 7, 10 or 11). The trench region 1207 preferably extends along an entire vertical side 1208 of the base region 1202 and the collector region 1203 and/or any remaining substrate. Thus, the trench region 1207 generally penetrates through the entire active layer of the vertical bipolar transistor 1200. Additionally, the trench region 1207 generally horizontally surrounds an entire active area of the vertical bipolar transistor 1200 (or the multiple fingers or the multiple devices of which the vertical bipolar transistor 1200 is a part). The active area thus surrounded is generally electrically isolated from other active areas of other devices or transistors on the same die. The manufacturing or fabrication process (including thinning of the semiconductor substrate) generally enables this feature for this and other embodiments of the present invention, as described below.

Some embodiments of the present invention can be described with reference to FIG. 13. FIG. 13 displays a vertical UMOS (or trench-MOS) device 1300 that may form part of an overall integrated circuit (IC) chip and that is in accordance with the present invention. The UMOS device 1300 generally comprises a first semiconductor (e.g. a drain) region 1301, a second semiconductor (e.g. a source) region 1302, a third semiconductor (e.g. a body/channel) region 1303 and a gate region 1304 (surrounded by an oxide/insulator 1305) within an active surface layer. The UMOS device 1300 also generally comprises a top electrode 1306 and a bottom electrode 1307. The manufacturing technique described below (including thinning of the semiconductor substrate and further backside processing), generally enables elimination of a (typically) n-region between the bottom of the gate region 1304 and the first semiconductor (e.g. the drain) region 1301. Therefore, the gate region 1304 preferably extends as a trench to the first semiconductor region 1301 or to the back side of the silicon substrate, resulting in a form of trench isolation and a lack of field concentration at the bottom of the trench. Consequently, the smooth U-shape of the bottom of the gate region of typical prior art UMOS devices is generally no longer required or beneficial. Additionally, similar to the above described vertical power devices, the silicon substrate is generally thinned, thereby reducing the vertical resistance of the UMOS device 1300 and allowing for greater thermal dissipation.

Also shown in FIG. 13 is a trench region 1308 (e.g. similar to trench region 310, 410, 709, 1008, 11081109 or 1207 of FIG. 3, 4, 7, 10, 11 or 12). The trench region 1308 preferably extends along an entire vertical side 1309 of the first and third semiconductor regions 1301 and 1303. Thus, the trench region 1308 generally penetrates through the entire active layer of the UMOS device 1300. Additionally, the trench region 1308 generally horizontally surrounds an entire active area of the UMOS device 1300 (or the multiple fingers or the multiple devices of which the UMOS device 1300 is a part). The active area thus surrounded is generally electrically isolated from other active areas of other devices or transistors on the same die. The manufacturing or fabrication process (including thinning of the semiconductor substrate) generally enables this feature for this and other embodiments of the present invention, as described below.

Some embodiments of the present invention can be described with reference to FIG. 14. FIG. 14 displays an alternative vertical UMOS (or trench-MOS) device 1400 that may form part of an overall integrated circuit (IC) chip and that is in accordance with the present invention. The UMOS device 1400 generally comprises a first semiconductor (e.g. a source) region 1401, a second semiconductor (e.g. a drain) region 1402, a third semiconductor (e.g. a body/channel) region 1403 and a gate region 1404 (surrounded by an oxide/insulator 1405) within an active surface layer. The UMOS device 1400 also generally comprises a top electrode 1406 and a bottom electrode (e.g. a contact, bump, pillar, etc.) 1407. In this embodiment, the gate region 1404 is so deep and the silicon substrate is so thinned that the gate region 1404 extends to the back side of the silicon substrate, resulting in a form of trench isolation and a lack of field concentration at the bottom of the trench. The large bottom electrode 1407 at the backside generally shorts out the first and third semiconductor regions (i.e. source and channel) 1401 and 1403, leaving the drain contact (i.e. the top electrode 1406) at the top. (This configuration thus has some similarities to the vertical power device 1000 described above with the bottom source/channel metal contact 1007.) The thinned silicon substrate reduces the vertical electrical resistance and thermal resistance. The large bottom electrode 1407 enhances the thermal dissipation.

Also shown in FIG. 14 is a trench region 1408 (e.g. similar to trench region 310, 410, 709, 1008, 11081109, 1207 or 1308 of FIG. 3, 4, 7, 10, 11, 12 or 13). The trench region 1408 preferably extends along an entire vertical side 1409 of the third semiconductor region 1403. Thus, the trench region 1408 generally penetrates through the entire active layer of the UMOS device 1400. Additionally, the trench region 1408 generally horizontally surrounds an entire active area of the UMOS device 1400 (or the multiple fingers or the multiple devices of which the UMOS device 1400 is a part). The active area thus surrounded is generally electrically isolated from other active areas of other devices or transistors on the same die. The manufacturing or fabrication process (including thinning of the semiconductor substrate) generally enables this feature for this and other embodiments of the present invention, as described below.

Some embodiments of the present invention can be described with reference to FIG. 15. FIG. 15 displays a vertical Gate Turn Off (GTO) thyristor 1500 that may form part of an overall integrated circuit (IC) chip and that is in accordance with the present invention. (A GTO thyristor is generally a controllable switch that can be turned on and off at a gate.) The GTO thyristor 1500 generally comprises a gate region 1501, a cathode region 1502, an anode region 1503, an N− region 1504 and a P region 1505 within an active surface layer. The GTO thyristor 1500 also generally comprises a gate contact 1506, a cathode contact 1507 and a bottom side anode contact 1508. (The GTO thyristor 1500 in this embodiment has a PN-PN structure from the anode region 1503 to the cathode region 1502. Other structure configurations are possible and within the scope of the present invention.) In general, the thinning of the silicon substrate, mention above for other embodiments, enables the GTO thyristor 1500 to be manufactured in the vertical configuration shown with low vertical electrical resistance and low thermal resistance. Additionally, the N− region 1504 can be made as thin as desired (e.g. about 0.1 μm to 1 μm in thickness) for high-performance, low-voltage operation.

Also shown in FIG. 15 is a trench region 1509 (e.g. similar to trench region 310, 410, 709, 1008, 11081109, 1207, 1308 or 1408 of FIG. 3, 4, 7, 10, 11, 12, 13 or 14). The trench region 1509 preferably extends along an entire vertical side 1510 of the regions 1503, 1504 and 1505. Thus, the trench region 1509 generally penetrates through the entire active layer of the GTO thyristor 1500. Additionally, the trench region 1509 generally horizontally surrounds an entire active area of the GTO thyristor 1500 (or the multiple fingers or the multiple devices of which the GTO thyristor 1500 is a part). The active area thus surrounded is generally electrically isolated from other active areas of other devices or transistors on the same die. The manufacturing or fabrication process (including thinning of the semiconductor substrate) generally enables this feature for this and other embodiments of the present invention, as described below.

Figure 16:
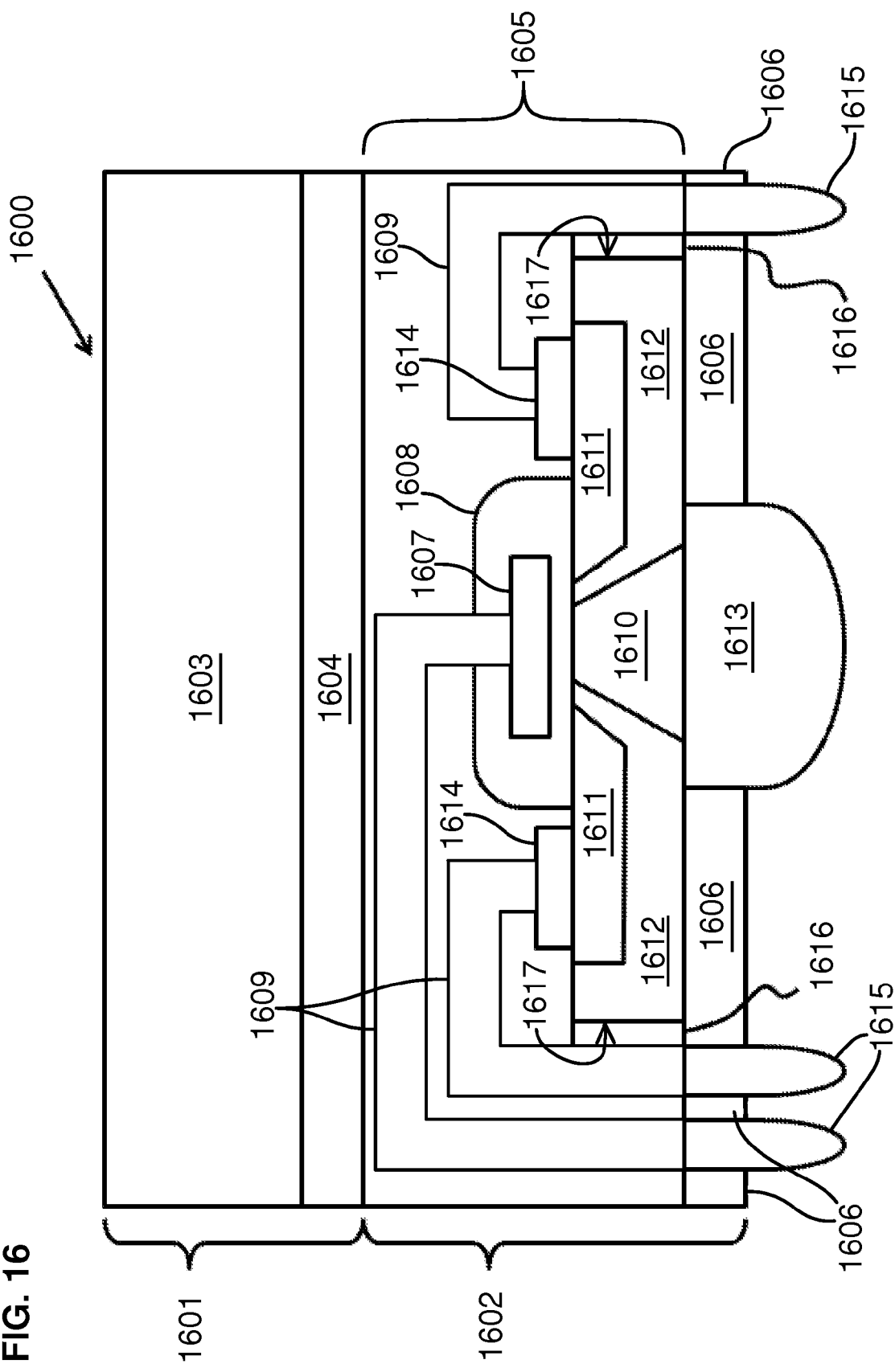
FIG. 16 is a simplified diagram of a cross-section of a layer transfer device having a vertical power device incorporating another alternative embodiment of the present invention.

Some embodiments of the present invention can be described with reference to FIG. 16. FIG. 16 displays a layer transfer device 1600 that may form part of an overall integrated circuit (IC) chip and that is in accordance with the present invention. The layer transfer device 1600 is generally a vertical power device with all transistor nodes contacted through the back side. The layer transfer device 1600 generally comprises a handle wafer layer 1601 and an initial wafer (e.g. formed with SOI or bulk semiconductor) layer 1602. The handle wafer layer 1601 generally comprises a handle substrate layer 1603 and a handle bond layer 1604. The initial wafer layer 1602 generally comprises an active layer 1605, an insulator layer 1606, a gate region 1607 (surrounded by an oxide/insulator 1608) and conductive (e.g. metal) wiring 1609 (separated by insulators). The active layer 1605 generally comprises first, second and third semiconductor regions 1610, 1611 and 1612. A semiconductor substrate in which the first, second and third semiconductor regions 1610, 1611 and 1612 are formed has preferably undergone thinning, as mentioned above for other embodiments. Similar to embodiments in accordance with FIGS. 3, 4 and 10, no portion of the first semiconductor region 1610 is below the third semiconductor region 1612, i.e. vertical and horizontal dimensions of the first semiconductor region 1610 have been minimized (e.g. to minimize parasitic capacitance, thermal resistance and electrical resistance). In the illustrated embodiment, the first semiconductor region 1610 and the third semiconductor region 1612 are both contacted to a single back side metal contact (or bottom electrode) 1613. Similar to the embodiment illustrated in FIG. 10, the third semiconductor region 1612 is preferably the body of the layer transfer vertical power device 1600, and the first semiconductor region 1610 is preferably the source. The second semiconductor region 1611 is preferably the drain of the layer transfer vertical power device 1600. The gate region 1607 and top side drain electrodes 1614 are preferably contacted through the metal wiring 1609 routed in the active layer 1605 through the back side of the layer transfer vertical power device 1600 to contacts 1615.

Several benefits accrue to the use of backside-contacted layer transfer vertical power devices in accordance with FIG. 16. The use of solder bumps or copper pillars on backside contacted layer transfer devices provides very low electrical impedance to ground. There are several reasons for this. One is that the distance through a bump or pillar is much shorter than the distance of a bond wire plus package lead. The shorter distance reduces both the resistance and the inductance of the transistor connections. Also, low source impedance improves efficiency of power devices. Additionally, flip-chip processing also can improve the isolation between connections of an integrated power device because bond wire and package interactions are avoided. Furthermore, since bumps or pillars can be placed at both the perimeter and across the surface of a die, while bond wire pads can only be placed at the perimeter of a die, a bumped or pillared die can have shorter lateral paths from active devices to off-chip electrical connections. Since the on-chip metallization can become the dominant series resistance of a large power device, any reduction in lateral metallization resistance will result in improved power device efficiency. The placement of the bumps or pillars directly over or closer to a transistor at the center of a die generally results in reduced lateral metallization resistance.

Also shown in FIG. 16 is a trench region 1616 (e.g. similar to trench region 310, 410, 709, 1008, 11081109, 1207, 1308, 1408 or 1509 of FIG. 3, 4, 7 or 10-15). The trench region 1616 preferably extends along an entire vertical side 1617 of the third semiconductor region 1612. Thus, the trench region 1616 generally penetrates through the entire active layer 1605 of the vertical power device 1600. Additionally, the trench region 1616 generally horizontally surrounds an entire active area of the layer transfer vertical power device 1600 (or the multiple fingers or the multiple power devices of which the layer transfer vertical power device 1600 is a part). The active area thus surrounded is generally electrically isolated from other active areas of other power devices or transistors on the same die. The manufacturing or fabrication process (including thinning of the semiconductor substrate) generally enables this feature for this and other embodiments of the present invention, as described below.

Benefits accrue to the use of the trench regions 1616 in accordance with FIG. 16. The presence of the trench regions 1616 within layer transfer vertical power devices, for instance, provides complete (or almost complete) dielectric isolation between the transistors in an overall integrated power device. Therefore, almost any circuit configuration can be obtained with the power transistors. Without isolation, on the other hand, only common drain circuits or single-transistor devices can be made with VDMOS. Additionally, conductive substrate noise can be completely (or almost completely) eliminated or minimized with dielectric isolation of the transistors. While some capacitive coupling will still be present, the transistors can be dielectrically isolated where desired. Substrate noise is a very large practical problem in integrated power devices that have large switching transistors that generate large amounts of substrate noise which can be picked up by sensitive analog circuits or can even cause digital circuit malfunction. Since so many alternate paths are typically present in bulk integrated power devices, except as described herein, it can be very difficult to isolate the specific causes and remedies for substrate-noise-induced problems.

Although the embodiments described above with reference to FIGS. 3, 4, 7 and 10-15 do not show a layer transfer device, it is understood that these embodiments are not necessarily so limited. Rather, variations of these embodiments are compatible with a layer transfer device, similar to the layer transfer vertical power device 1600. Therefore, many, if not all, of the benefits that thus accrue to the layer transfer vertical power device 1600, by virtue of being manufactured with layer transfer techniques, may also apply to these other embodiments.

Figure 17:
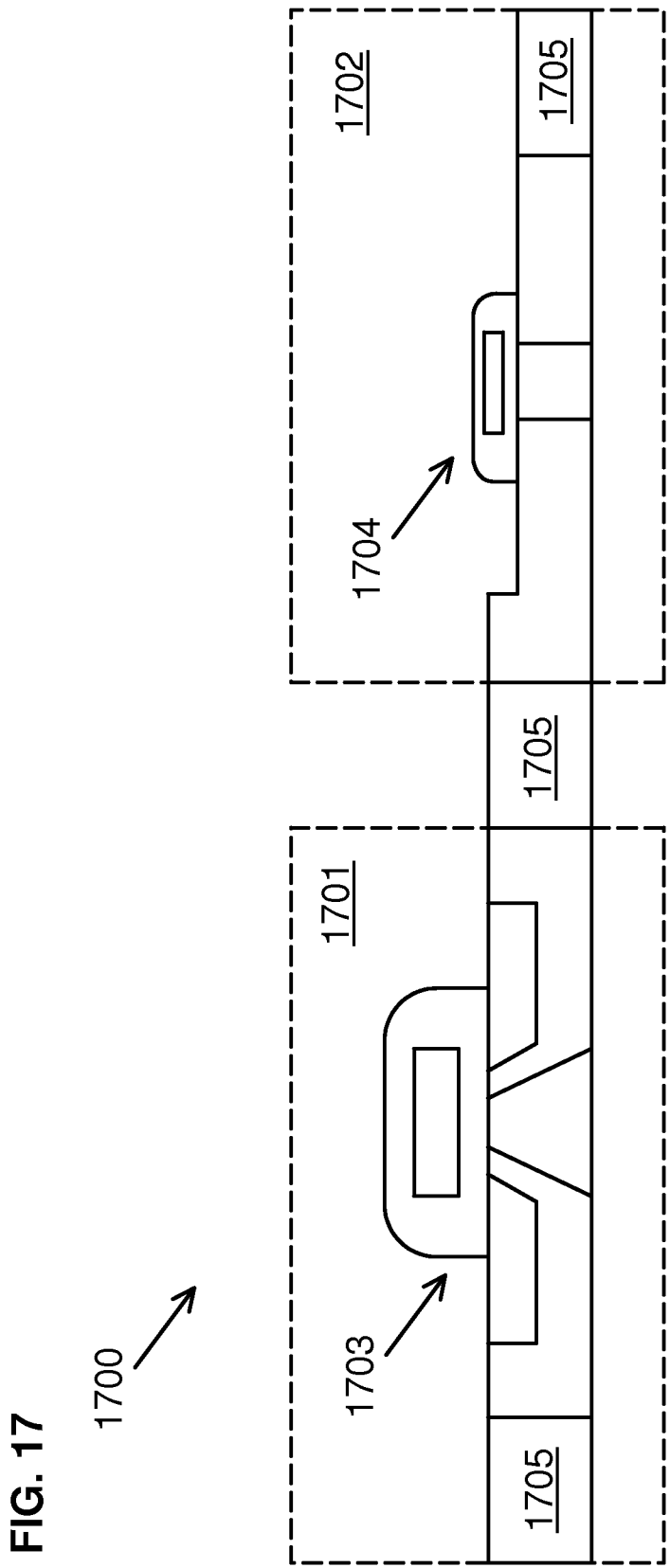
FIG. 17 is a simplified diagram of a cross-section of a semiconductor die having multiple devices and incorporating an embodiment of the present invention.

Some embodiments of the present invention can be described with reference to FIG. 17. FIG. 17 displays a silicon die (or IC chip) 1700 that is in accordance with the present invention. The silicon die 1700 generally comprises a first region 1701 having a first thickness and a second region 1702 having a second thickness smaller than the thickness of the first region 1701. The silicon in the first region 1701, for example, could have a thickness of about 0.8 μm and could comprise one or more vertical devices 1703, as described above. The silicon in the second region 1702, for example, could have a thickness of 80 nanometers (nm) and could comprise various high-performance switches and low-power digital logic (i.e. non-vertical semiconductor devices) 1704. Any desired number and combination of the vertical semiconductor devices described above can be combined on a single die in this fashion within the first region 1701. Some embodiments of the present invention could therefore allow for optimized power devices alongside other functions, such as RF switching or digital logic blocks. In some embodiments of the present invention, regions of trench isolation 1705 (e.g. similar to trench region 310, 410, 709, 1008, 11081109, 1207, 1308, 1408, 1509 or 1616 of FIG. 3, 4, 7 or 10-16) penetrating through entire active layers within the first and second regions 1701 down to a buried insulator layer (not shown) preferably provide sufficient electrical isolation for the different portions of the die 1700 to operate independently of each other. As a result, not only can the silicon die 1700 have multiple vertical semiconductor devices, but the bottom side of each device can be accessed and contacted independently of the others. It is, therefore, unnecessary for the multiple devices to have a common drain, for example. Additionally, such embodiments enable a vertical power device (such as those described above) to be integrated on a single IC chip or silicon die with various converters, analog circuitry and a microprocessor (among other possible components) and yet be able to efficiently dissipate heat (e.g. through the back side) generated by the various components.

In some embodiments of the present invention, the doping of the first semiconductor region (as described above) will be much higher near the back side contact area. This configuration allows for reduced resistance in the first semiconductor area and lower back side contact resistance. In some embodiments wherein the first semiconductor region is the drain region of the vertical power device, this configuration will result in lower drain resistance while keeping the threshold voltage low and saturation drive current high. In some embodiments of the present invention, the gate insulator (as described above) can be thicker in the center of the drain region. This will result in a reduced gate to drain capacitance. Embodiments of the present invention that are in accordance with these principles will generally exhibit improved speed performance given the reduction of internal capacitance and resistance.

Figure 18:
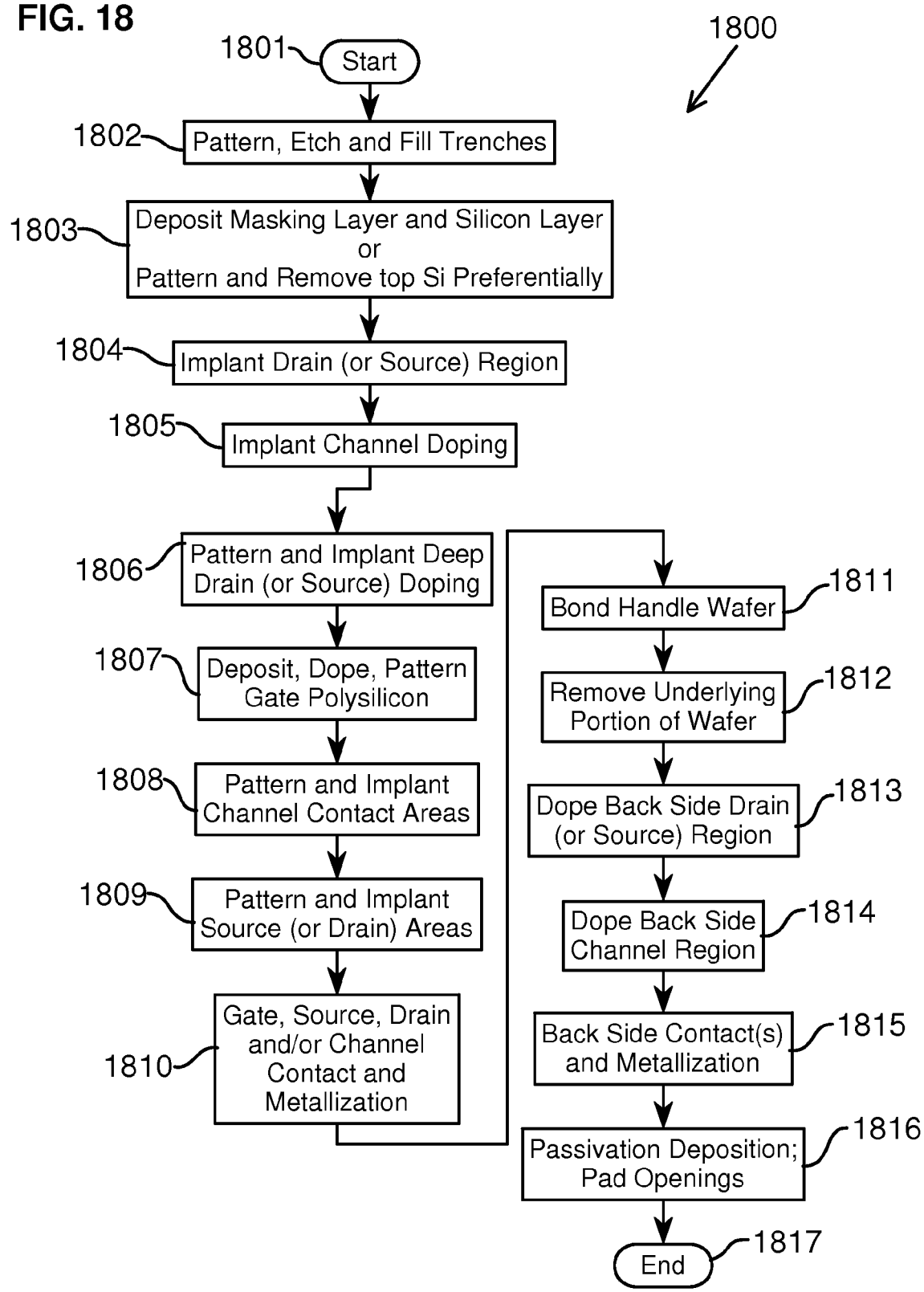
FIG. 18 is a simplified flow chart for a process for fabricating one or more of the devices shown in FIGS. 3-10, 13, 14, 16 and/or 17, according to an embodiment of the present invention.

FIG. 18 shows a process 1800 for fabricating one or more of the devices (e.g. similar to device 300, 400, 500, 600, 700, 800, 900, 1000, 1300, 1400, 1600, 1703 or 1704) shown in FIGS. 3-10 and 13, 14, 16 and 17, according to some embodiments of the present invention. It is understood, however, that the specific process 1800 is shown for illustrative purposes only and that other embodiments (in addition to specifically mentioned alternative embodiments) may involve other processes or multiple processes with other individual steps or a different order or combination of steps and still be within the scope of the present invention.

The process 1800 preferably starts (at 1801) with an SOI wafer or a bulk semiconductor wafer. An acceptable SOI wafer for some of the above described embodiments preferably has a top silicon (Si) layer, e.g. about 0.2-1.0 μm to tens of microns in thickness.

At 1802, various trench isolation regions (e.g. similar to trench region 310, 410, 709, 1008, 1308, 1408, 1616 or 1705) are preferably patterned, etched and deposited/filled to isolate (as desired) the various devices that are to be formed in the wafer. The trench isolation regions may be formed by a trench etch or by a through-semiconductor via (TSV) etch to form relatively deep trenches or TSV structures followed by placement of an oxide/insulating material, as desired. For embodiments using an SOI wafer, the trench isolation regions are preferably formed down to (or almost down to, or at least down to) the buried oxide layer. Additionally, the vertical gate trench (including gate polysilicon) for the gate region 1304 or 1404 and the oxide/insulator 1305 or 1405 of the UMOS device 1300 or 1400 may be formed with the various trench isolation regions or formed in one or more separate processing steps as desired. Additionally, the trench isolation regions are preferably formed deep enough into the wafer that subsequent thinning of the wafer or removal of bottom portions of the wafer will result in the trench isolation regions generally penetrating through the entire active layer of the remaining wafer.

At 1803, for embodiments according to FIG. 17, a high-temperature-tolerant epitaxial masking layer such as SiO2 or Si3N4 is preferably patterned on the wafer. Then silicon is preferably epitaxially deposited in region 1701 in sufficient amount for the vertical device(s) that are to be formed. Alternatively, the top silicon of the wafer is patterned and removed (or thinned) preferentially for the second region 1702. This removal can be done, for example, with a silicon etch, with preferential consumption of silicon through oxidation in a LOCOS-style process step. The silicon may be thinned as desired to make SOI CMOS devices (for example, if fully-depleted CMOS devices are desired for high-performance RF switch applications).

At 1804, the central drain or source region is patterned and implanted, e.g. with N− dopant in region 301, 401, 701, 1001, 1610. For embodiments according to FIGS. 13 and 14 (UMOS examples), on the other hand, the lower drain or source region is formed as described below.

At 1805, channel region doping is patterned and implanted, e.g. in region 303, 403, 506, 604, 703, 805, 904, 1003, 1303, 1403 or 1612. For embodiments according to FIG. 17, the channel doping may be implanted for both the first and second regions 1701 and 1702 at 1805 or in separate fabrication steps. Alternatively, 1805 may be skipped if appropriate channel doping is present in the top silicon layer when the SOI wafer or the bulk semiconductor wafer is manufactured. Optionally, the channel doping may be implanted later, as described below.

At 1806, deep drain or source region doping is patterned and implanted, e.g. with N+ dopant in region 301, 401, 701, 1001, 1301, 1401 or 1610. For embodiments according to FIG. 17, the deep drain or source doping is preferably performed for the first region 1701. Optionally, since the regions 301, 401, 701, 1001, 1301, 1401 and 1610 are accessible from the back side of the wafer after further processing, 1806 may be skipped, and the appropriate doping may be done through the back side later, as described below.

At 1807, gate polysilicon is deposited, doped and patterned, e.g. in region 304, 404, 503, 504, 601, 602, 704, 801, 802, 901, 902, 903, 1004 or 1607. For embodiments according to FIGS. 13 and 14 (UMOS examples), on the other hand, the gate polysilicon was preferably formed as described above.

At 1808, channel contact areas are patterned and shallow and/or deep implanted, e.g. with P+ dopant in exposed portions of region 303, 403, 506, 604, 703, 805, 904, 1003, 1303, 1403 or 1612. For embodiments according to FIG. 17, the channel contact and implantation is preferably performed for the first region 1701. Optionally, since the regions 403, 506, 604, 703, 805, 904, 1003, 1403 or 1612 are accessible from the back side of the wafer after further processing, 1808 may be skipped, and the appropriate patterning and implanting may be done through the back side later, as described below. Alternatively, this patterning and implanting may be done on both the front and back sides.

At 1809, source or drain region doping is patterned and shallow and/or deep implanted, e.g. with N+ dopant in region 302, 402, 505, 603, 702, 804, 905, 1002, 1302, 1402 or 1611. For embodiments according to FIG. 17, the source or drain doping is preferably performed in both the first and second regions 1701 and 1702, but optionally each region 1701 and 1702 can be separately patterned and implanted.

At 1810, contact and metallization layers (with separating dielectric material) are formed for top side connections (e.g. top electrodes 308, 407, 706, 1006, 1306, 1406 and 1614, the metal wiring 1609, etc.) to the gate region, the source or drain regions and/or the channel regions (as desired and if accessible from the top side), e.g. for region 302, 303, 304, 402, 403, 404, 503, 505, 506, 601, 603, 604, 702, 703, 704, 801, 804, 805, 901, 902, 904, 905, 1002, 1004, 1302, 1303, 1304, 1402, 1404, 1607 or 1611. For embodiments according to FIG. 17, the gate, source, drain and/or channel contacts and metallization may generally be made for both the first and second regions 1701 and 1702 as desired.

At 1811, a handle wafer (e.g. for embodiments using the handle wafer layer 1601) is preferably bonded to the exposed top surface of the original wafer that has generally received the preceding processing, e.g. the SOI wafer. The handle wafer may be made of Si, quartz, sapphire, AlN, SiC, etc. Additionally, a heat spreading layer may optionally be placed between the SOI wafer and the handle wafer. For embodiments not using the handle wafer layer 1601, the handle wafer may be temporarily bonded to the original wafer if the handle wafer is needed for physical support of the original wafer during subsequent processing. In which case, the handle wafer may be removed when appropriate. For some embodiments (e.g. some embodiments using the bulk semiconductor wafer), it may not be necessary to perform 1811 if the original wafer can be thinned or further processed, as described below, without needing the additional physical support of the handle wafer.

At 1812, an underlying portion of the original wafer is preferably removed or thinned. For embodiments using an SOI wafer, for example, the substrate under the buried oxide is generally removed up to (and preferably including portions of) the buried oxide. For embodiments using a bulk semiconductor wafer, on the other hand, the substrate is generally thinned from the bottom side until the trench regions or TSV structures are exposed. In this manner, the trench isolation regions formed at 1802 are generally left penetrating through the entire active layer of the remaining wafer, preferably with only an insulation layer (e.g. the buried oxide or a deposited insulator layer), if anything, underlying the active layer and the trench isolation regions at this point.

At 1813, the drain (or source) region is preferably selectively doped from the back side (if not done through deep implantation above at 1806), e.g. with N+ dopant in region 301, 401, 701, 1001, 1301, 1401 or 1610. For embodiments according to FIG. 17, the back side drain or source doping is preferably performed for the first region 1701. Additionally, if metals are present from the previous processing that are tolerant only to low temperature processing, then the backside doping at 1813 can preferably be performed with an implant (which typically involves a low temperature) followed by dopant activation with a very short-time anneal, such as a laser or e-beam anneal.

At 1814, contact areas for the channel region (in embodiments in which the channel region is to be contacted at the back side) are preferably doped from the back side, e.g. with P+ dopant in region 403, 703, 1003, 1403, 1612. In some embodiments, such as the embodiment of FIG. 7, the back side contact areas for the channel region (e.g. 703) are outside of the plane of the drawing. For embodiments according to FIG. 17, the back side channel contact region is preferably doped for the first region 1701.

At 1815, patterned contact and metallization are formed for desired back side connections (e.g. bottom electrodes and contacts 309, 408, 409, 707, 708, 1007, 1307, 1407, 1613, etc.) to the drain regions, the source regions and/or the channel regions (as desired and if accessible from the bottom side), e.g. for region 301, 401, 403, 701, 702, 703, 1001, 1003, 1301, 1401, 1403, 1610 or 1612. Further metallization (with separating dielectric material) is also preferably performed to the back side for those regions having top side contacts that are routed down to the back side, e.g. for contacts 1615. For embodiments according to FIG. 17, the back side contacts are generally formed for both the first and second regions 1701 and 1702, as desired.

At 1816, various passivation deposition techniques are performed and pad openings are formed to generally complete the overall IC chip. The process 1800 then preferably ends at 1817.

Figure 19:
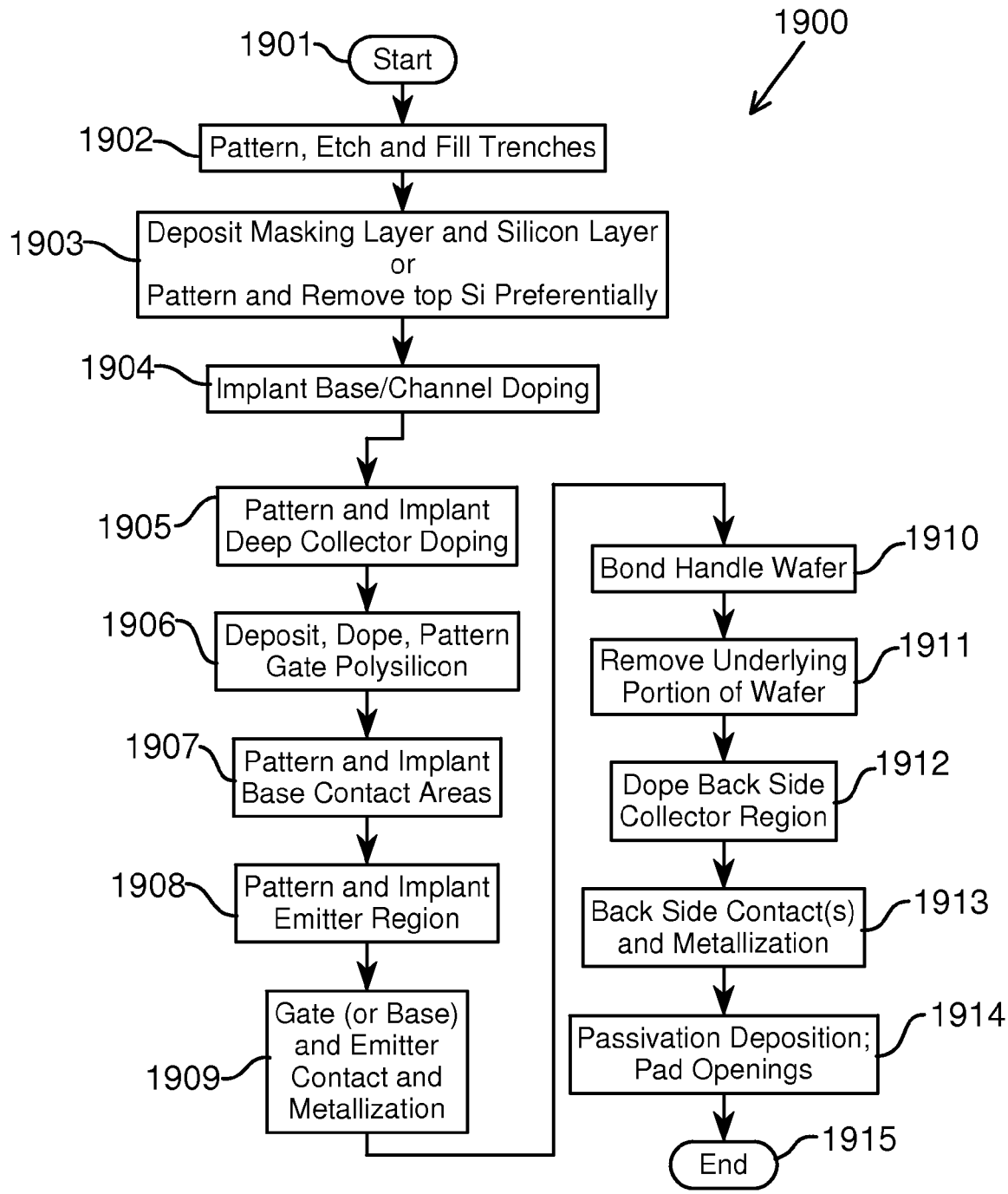
FIG. 19 is a simplified flow chart for a process for fabricating one or more of the devices shown in FIGS. 11 and/or 12, according to an embodiment of the present invention.

FIG. 19 shows a process 1900 for fabricating one or more of the devices (e.g. similar to the IGBT device 1100 or the vertical bipolar transistor 1200) shown in FIGS. 11 and 12, according to some embodiments of the present invention. It is understood, however, that the specific process 1900 is shown for illustrative purposes only and that other embodiments (in addition to specifically mentioned alternative embodiments) may involve other processes or multiple processes with other individual steps or a different order or combination of steps and still be within the scope of the present invention.

The process 1900 preferably starts (at 1901) with an SOI wafer or a bulk semiconductor wafer. An acceptable SOI wafer for some of the above described embodiments preferably has a top silicon (Si) layer, e.g. about 1.0 μm to tens of microns in thickness.

At 1902, similar to 1802 above, various trench isolation regions (e.g. similar to trench region 1109 or 1207) are preferably patterned, etched and deposited/filled to isolate (as desired) the various devices that are to be formed in the wafer. The trench isolation regions may be formed by a trench etch or by a TSV etch to form relatively deep trenches or TSV structures followed by placement of an oxide/insulating material, as desired. For embodiments using an SOI wafer, the trench isolation regions are preferably formed down to (or almost down to, or at least down to) the buried oxide layer. Additionally, the trench isolation regions are preferably formed deep enough into the wafer that subsequent thinning of the wafer or removal of bottom portions of the wafer will result in the trench isolation regions generally penetrating through the entire active layer of the remaining wafer.

At 1903, similar to 1803 above, for embodiments according to FIG. 17, a high-temperature-tolerant epitaxial masking layer such as SiO2 or Si3N4 is preferably patterned on the wafer. Then silicon is preferably epitaxially deposited in region 1701 in sufficient amount for the vertical device(s) that are to be formed. Alternatively, the top silicon of the wafer is patterned and removed (or thinned) preferentially for the second region 1702. This removal can be done, for example, with a silicon etch, with preferential consumption of silicon through oxidation in a LOCOS-style process step. The silicon may be thinned as desired to make SOI CMOS devices (for example, if fully-depleted CMOS devices are desired for high-performance RF switch applications).

At 1904, the channel region 1102 (FIG. 11) or the base region 1202 (FIG. 12) doping is patterned and implanted. Alternatively, 1904 may be skipped if appropriate channel or base doping is present in the top silicon layer when the SOI wafer or the bulk semiconductor wafer is manufactured.

At 1905, the collector region 1104 or 1203 is patterned and deep implanted, e.g. with P+ dopant. Alternatively, the deep collector doping at 1905 is skipped, and the collector doping is done later from the back side, as described below.

At 1906, for embodiments according to FIG. 11, gate polysilicon is deposited, doped and patterned, e.g. in the gate region 1105.

At 1907, the base contact areas are preferably patterned and implanted, e.g. with P+ dopant in region 1101 or 1202.

At 1908, the emitter region 1103 or 1201 is preferably patterned and implanted, e.g. with N+ dopant.

At 1909, contact and metallization layers (with separating dielectric material) are formed for top side connections (as desired and if accessible from the top side). For embodiments according to FIG. 11, contact and metallization layers are formed for the gate region 1105 and the base and emitter regions 1101 and 1103 (e.g. the emitter/base electrode 1106). For embodiments according to FIG. 12, on the other hand, contact and metallization layers are formed for the base region 1202 (e.g. base electrode 1205) and the emitter region 1201 (e.g. emitter electrode 1204).

At 1910, similar to 1811 above, a handle wafer (e.g. for embodiments using the handle wafer layer 1601) is preferably bonded to the exposed top surface of the original wafer that has generally received the preceding processing, e.g. the SOI wafer. The handle wafer may be made of Si, quartz, sapphire, AlN, SiC, etc. Additionally, a heat spreading layer may optionally be placed between the SOI wafer and the handle wafer. For embodiments not using the handle wafer layer 1601, the handle wafer may be temporarily bonded to the original wafer if the handle wafer is needed for physical support of the original wafer during subsequent processing. In which case, the handle wafer may be removed when appropriate. For some embodiments (e.g. some embodiments using the bulk semiconductor wafer), it may not be necessary to perform 1910 if the original wafer can be thinned or further processed, as described below, without needing the additional physical support of the handle wafer.

At 1911, similar to 1812 above, an underlying portion of the original wafer is preferably removed or thinned. For embodiments using an SOI wafer, for example, the substrate under the buried oxide is generally removed up to (and preferably including portions of) the buried oxide. For embodiments using a bulk semiconductor wafer, on the other hand, the substrate is generally thinned from the bottom side until the trench regions or TSV structures are exposed. In this manner, the trench isolation regions formed at 1902 are generally left penetrating through the entire active layer of the remaining wafer, preferably with only an insulation layer (e.g. the buried oxide or a deposited insulator layer), if anything, underlying the active layer and the trench isolation regions at this point.

At 1912, the collector region 1104 or 1203 is preferably doped from the back side, if not already done by deep implantation from the front side at 1905. For embodiments in accordance with FIG. 11, a P+ dopant is used. For embodiments in accordance with FIG. 12, on the other hand, an N+ dopant is used.

At 1913, similar to 1815 above, patterned contact and metallization are formed for desired back side connections (e.g. bottom electrodes and contacts 1107, 1206, etc.) to the collector region 1104 or 1203. Further metallization (with separating dielectric material) is also preferably performed to the back side for those regions having top side contacts that are routed down to the back side.

At 1914, similar to 1816 above, various passivation deposition techniques are performed and pad openings are formed to generally complete the overall IC chip. The process 1900 then preferably ends at 1915.

Figure 20:
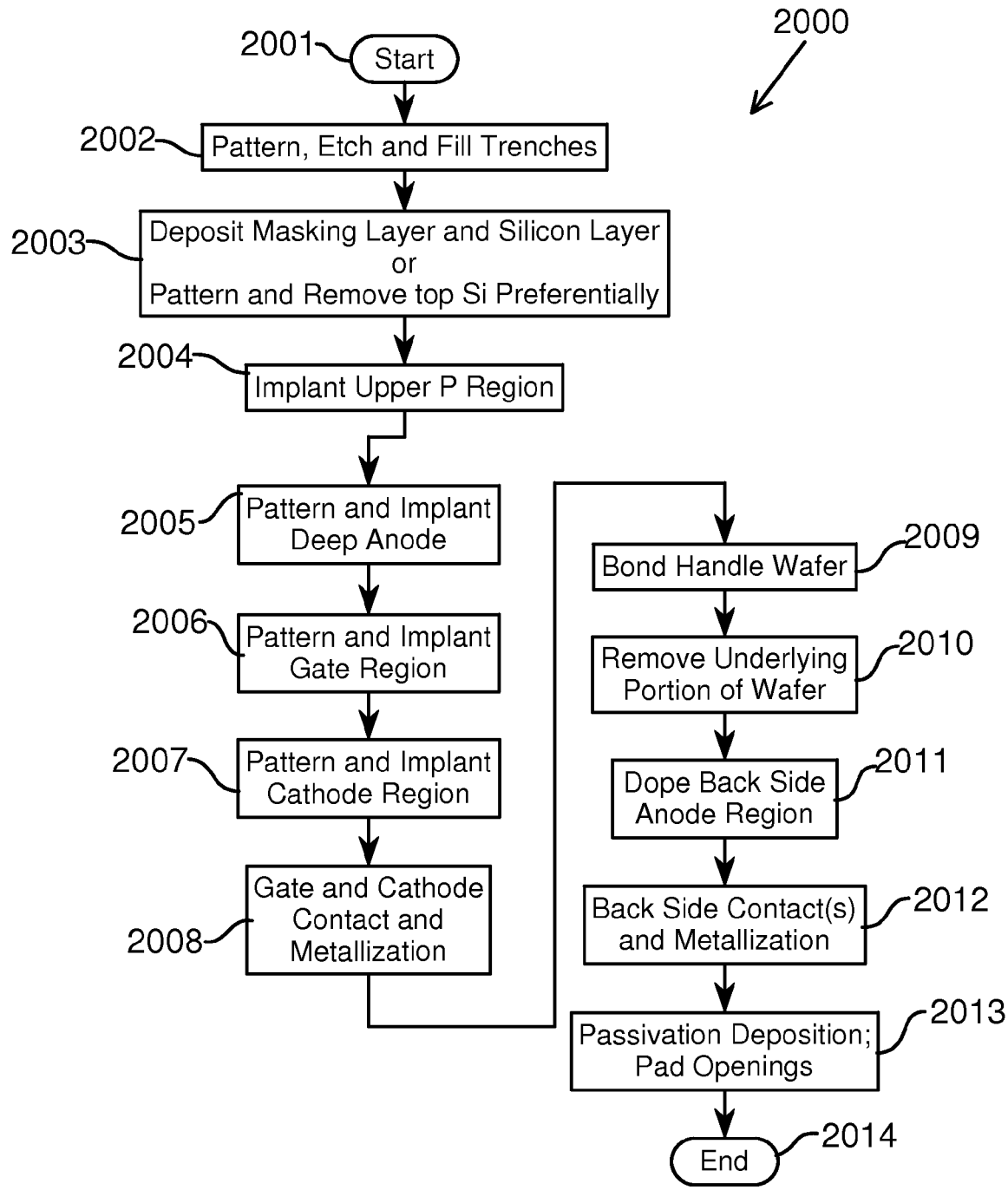
FIG. 20 is a simplified flow chart for a process for fabricating one or more of the devices shown in FIG. 15, according to an embodiment of the present invention.

FIG. 20 shows a process 2000 for fabricating the device (e.g. similar to device 1500) shown in FIG. 15, according to some embodiments of the present invention. It is understood, however, that the specific process 2000 is shown for illustrative purposes only and that other embodiments (in addition to specifically mentioned alternative embodiments) may involve other processes or multiple processes with other individual steps or a different order or combination of steps and still be within the scope of the present invention.

The process 2000 preferably starts (at 2001) with an SW wafer or a bulk semiconductor wafer. An acceptable SW wafer for some of the above described embodiments preferably has a top silicon (Si) layer, e.g. about 1.0 μm to tens of microns in thickness.

At 2002, similar to 1802 or 1902 above, various trench isolation regions (e.g. similar to trench region 1509) are preferably patterned, etched and deposited/filled to isolate (as desired) the various devices that are to be formed in the wafer. The trench isolation regions may be formed by a trench etch or by a TSV etch to form relatively deep trenches or TSV structures followed by placement of an oxide/insulating material, as desired. For embodiments using an SOI wafer, the trench isolation regions are preferably formed down to (or almost down to, or at least down to) the buried oxide layer. Additionally, the trench isolation regions are preferably formed deep enough into the wafer that subsequent thinning of the wafer or removal of bottom portions of the wafer will result in the trench isolation regions generally penetrating through the entire active layer of the remaining wafer.

At 2003, similar to 1803 or 1903 above, for embodiments according to FIG. 17, a high-temperature-tolerant epitaxial masking layer such as SiO2 or Si3N4 is preferably patterned on the wafer. Then silicon is preferably epitaxially deposited in region 1701 in sufficient amount for the vertical device(s) that are to be formed. Alternatively, the top silicon of the wafer is patterned and removed (or thinned) preferentially for the second region 1702. This removal can be done, for example, with a silicon etch, with preferential consumption of silicon through oxidation in a LOCOS-style process step. The silicon may be thinned as desired to make SOI CMOS devices (for example, if fully-depleted CMOS devices are desired for high-performance RF switch applications).

At 2004, if N− doping is present in the top silicon layer when the SOI wafer or the bulk semiconductor wafer is manufactured, then the upper P region 1505 is preferably implanted with P dopant. Otherwise, 2004 is preferably preceded by implanting the N− dopant in the N− region 1504.

At 2005, the anode region 1503 is preferably patterned and deep implanted, e.g. with P+ dopant. Alternatively, the deep anode implanting at 2005 is skipped, and the anode implanting is done later from the back side, as described below.

At 2006, the gate region 1501 is preferably patterned and implanted, e.g. with P+ dopant. Additionally, at 2007, the cathode region 1502 is preferably patterned and implanted, e.g. with N+ dopant.

At 2008, contact and metallization layers (with separating dielectric material) are formed for top side connections, e.g. gate contact 1506 and cathode contact 1507.

At 2009, similar to 1811 or 1910 above, a handle wafer (e.g. for embodiments using the handle wafer layer 1601) is preferably bonded to the exposed top surface of the original wafer that has generally received the preceding processing, e.g. the SOI wafer. The handle wafer may be made of Si, quartz, sapphire, AlN, SiC, etc. Additionally, a heat spreading layer may optionally be placed between the SOI wafer and the handle wafer. For embodiments not using the handle wafer layer 1601, the handle wafer may be temporarily bonded to the original wafer if the handle wafer is needed for physical support of the original wafer during subsequent processing. In which case, the handle wafer may be removed when appropriate. For some embodiments (e.g. some embodiments using the bulk semiconductor wafer), it may not be necessary to perform 2009 if the original wafer can be thinned or further processed, as described below, without needing the additional physical support of the handle wafer.

At 2010, similar to 1812 or 1911 above, an underlying portion of the original wafer is preferably removed or thinned. For embodiments using an SOI wafer, for example, the substrate under the buried oxide is generally removed up to (and preferably including portions of) the buried oxide. For embodiments using a bulk semiconductor wafer, on the other hand, the substrate is generally thinned from the bottom side until the trench regions or TSV structures are exposed. In this manner, the trench isolation regions formed at 2002 are generally left penetrating through the entire active layer of the remaining wafer, preferably with only an insulation layer (e.g. the buried oxide or a deposited insulator layer), if anything, underlying the active layer and the trench isolation regions at this point.

At 2011, the anode region 1503 is preferably doped from the back side, if not already done by deep implantation from the front side at 2005.

At 2012, similar to 1815 or 1913 above, patterned contact and metallization are formed for desired back side connections (e.g. bottom side anode contact 1508, etc.) to the anode region 1503. Further metallization (with separating dielectric material) is also preferably performed to the back side for those regions having top side contacts that are routed down to the back side.

At 2013, similar to 1816 or 1914 above, various passivation deposition techniques are performed and pad openings are formed to generally complete the overall IC chip. The process 2000 then preferably ends at 2014.

Although embodiments of the present invention have been discussed primarily with respect to specific embodiments thereof, other variations are possible. Various configurations of the described system may be used in place of, or in addition to, the configurations presented herein. For example, multiple fingers of each type of power device discussed could share the same trench isolated area. Also, multiple types of power devices discussed herein could share the same trench isolated area, could share the same first semiconductor region, or could share both. In addition, the vertical power devices were often described using n-type devices as an example but the present invention can implement p-type or n-type devices. Also, additional layers of passivation and insulation could be disposed in-between described layers where appropriate.

Those skilled in the art will appreciate that the foregoing description is by way of example only, and is not intended to limit the present invention. Nothing in the disclosure should indicate that the present invention is limited to systems that are implemented on a single wafer. Nothing in the disclosure should indicate that the present invention is limited to systems that require a particular form of semiconductor processing or to integrated circuits. Functions may be performed by hardware or software, as desired. In general, any diagrams presented are only intended to indicate one possible configuration, and many variations are possible. Those skilled in the art will also appreciate that methods and systems consistent with the present invention are suitable for use in a wide range of applications encompassing any related to power devices.

While the specification has been described in detail with respect to specific embodiments of the present invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. An integrated circuit chip comprising:
an active semiconductor region having a plurality of fabricated semiconductor structures comprising a source, drain and channel that form a vertical semiconductor device, the active semiconductor region being exposed on a bottom side by the absence of substrate material such that the source and channel of the semiconductor structures are exposed semiconductor structures that provide the vertical semiconductor device with an electrical contact, wherein bottom surfaces of the exposed semiconductor structures are coplanar;
a bottom side electrode connected to at least one of the source or the channel; and
a handle wafer layer located above the active semiconductor region.

2. The integrated circuit chip of claim 1, wherein:
the plurality of semiconductor structures form a plurality of vertical semiconductor devices; and
each of the plurality of vertical semiconductor devices is connected to a separate bottom side electrode.

3. The integrated circuit chip of claim 1, wherein:
the plurality of semiconductor structures form a plurality of vertical semiconductor devices; and
at least two of the plurality of vertical semiconductor devices are connected to the bottom side electrode.

4. The integrated circuit chip of claim 1, further comprising:
a trench region extending along a vertical side of the active semiconductor region and horizontally surrounding the active semiconductor region;
wherein the trench region electrically isolates the vertical semiconductor device on the integrated circuit chip.

5. The integrated circuit chip of claim 4, wherein:
the vertical semiconductor device is contained within a first region of the integrated circuit chip;
the first region of the integrated circuit chip has a first thickness;

a second region of the integrated circuit chip has a second thickness that is smaller than the first thickness, and the second region contains at least one non-vertical semiconductor device; and the trench region electrically isolates the first region from the second region.

6. The integrated circuit chip of claim 1, wherein a vertical or horizontal dimension of at least one of the semiconductor structures has been minimized to reduce parasitic capacitance in the vertical semiconductor device.

7. The integrated circuit of claim 1, wherein the bottom side electrode is connected to both the source and the channel.

8. The integrated circuit of claim 1, wherein the active semiconductor region is formed in a semiconductor on insulator (SOI) wafer.

9. The integrated circuit chip of claim 1, wherein:
the channel isolates the source from the drain;
the channel has a bottom boundary and a side boundary extending downward from a top surface of the active semiconductor region to the bottom boundary; and
the source and channel are in contact along the side boundary and are not in contact along the bottom boundary.

10. The integrated circuit chip of claim 9, wherein:
the bottom side electrode is connected to the source; and
a second bottom side electrode is connected to the channel.

11. The integrated circuit chip of claim 9, wherein the source and the channel are both connected to the bottom side electrode.

12. The integrated circuit chip of claim 9, wherein:
the drain has a second bottom boundary and a second side boundary extending downward from the top surface of the active semiconductor region to the second bottom boundary; and
the drain and the channel are in contact along the second side boundary and are not in contact along the second bottom boundary.

13. The integrated circuit chip of claim 12, wherein:
the bottom side electrode is connected to the source;
a second bottom side electrode is connected to the drain;
a third bottom side electrode is connected to the channel; and
the bottom side electrode, the second bottom side electrode and the third bottom side electrode are electrically isolated from each other.

* * * * *